(12) United States Patent
Fukumoto

(10) Patent No.: US 6,370,058 B1
(45) Date of Patent: Apr. 9, 2002

(54) NON-VOLATILE SEMICONDUCTOR MEMORY DEVICE AND SYSTEM LSI INCLUDING THE SAME

(75) Inventor: Katsumi Fukumoto, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/656,314

(22) Filed: Sep. 6, 2000

(30) Foreign Application Priority Data

Jan. 21, 2000 (JP) ........................................ 2000-013565

(51) Int. Cl.$^7$ .............................................. G11C 14/00
(52) U.S. Cl. .................... 365/185.08; 365/145
(58) Field of Search ........................... 365/185.08, 145, 365/129, 185.01

(56) References Cited

U.S. PATENT DOCUMENTS

| | | | |
|---|---|---|---|
| 4,924,375 A | 5/1990 | Fung et al. | 711/157 |
| 5,381,379 A | 1/1995 | Fukumoto | 365/238.5 |
| 5,400,275 A | 3/1995 | Abe et al. | |
| 5,566,311 A | 10/1996 | Gochi | |
| 5,619,470 A | 4/1997 | Fukumoto | |

FOREIGN PATENT DOCUMENTS

| | | |
|---|---|---|
| JP | 7-13859 | 1/1799 |
| JP | 4-42498 | 2/1992 |

OTHER PUBLICATIONS

Fukumoto, K. et al., (May 1991) "A 256K bit non–volatile PSRAM with page recall and chip store" *Sym. VLSI Circuit Dig. Tech. Papers.*, pp. 91–92.

Fukumoto, K. et al., (Jun. 1991) "Development of 256K bit non–volatile DRAM (NV–DRAM) operating as a pseudo–SRAM" *Sharp Technical Journal*, 49:45–49 (English abstract included).

Evans, J.T. and Womack, R. (Oct. 1998) "An experimental 512–bit nonvolatile memory with ferroelectric storage cell" *IEEE Journal of Solid State Circuits*, 23(5):233–237.

Moazzami, R. et al., (Oct. 1990) :A ferroelectric DRAM cell for high–density NVRAM's *IEEE Electron Device Lett.*, 11(10):238–240.

*Primary Examiner*—Hoai V. Ho
(74) *Attorney, Agent, or Firm*—Morrison & Foerster LLP

(57) ABSTRACT

A non-volatile semiconductor memory device includes a memory cell array capable of storing data in volatile and non-volatile states, and a determination circuit for determining whether a row address in a current cycle is the same as that in a previous cycle. When the row address in the current cycle is different from that in the previous cycle, a store operation is performed, where volatile data is stored in the memory cell as non-volatile data; thereafter a recall operation is performed where non-volatile data stored in the memory cell is transformed into volatile data; the resulting volatile data is stored in the memory cell and a sense amplifier, or at least one of the sense amplifier and a latch circuit. When the row address in the current cycle is the same as that in the previous cycle, a read or write operation is performed with respect to volatile data stored in the memory cell, the sense amplifier or latch circuit, but non-volatile data is not read from or written to the memory cell.

13 Claims, 17 Drawing Sheets

FIG. 13 Store mode When data is "0"
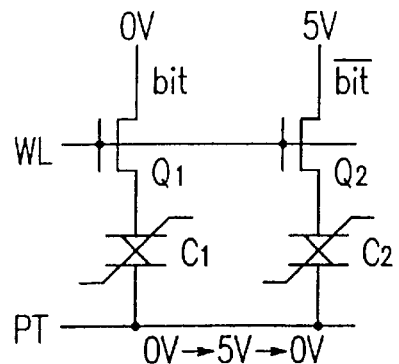
FIG. 14 Store mode When data is "1"
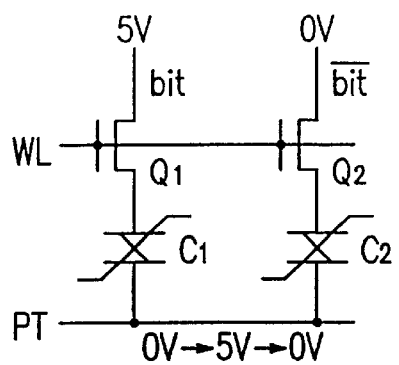
FIG. 15 Recall mode
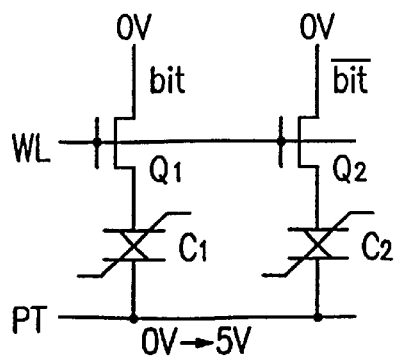

(Prior Art)  Conventional 4k-bit parallel FRAM (Prior Art)  Conventional 64k-bit parallel FRAM

NON-VOLATILE SEMICONDUCTOR MEMORY DEVICE AND SYSTEM LSI INCLUDING THE SAME

BACKGROUND OF THE INVENTION

1. Field of the Invention

The present invention relates to a non-volatile memory device including a memory cell having volatile and non-volatile data storage capacity. More particularly, the present invention relates to a Non-Volatile Dynamic Random Access Memory (hereinafter referred to as "NVDRAM") including a memory cell having a combination of a Dynamic Random Access Memory (hereinafter referred to as "DRAM") as a volatile data storage means and a Electrically Erasable and Programmable Read Only Memory (hereinafter referred to as "EEPROM") as a non-volatile data storage means, or a memory cell having volatile and non-volatile data storage capacity using a ferroelectric material. Further, the present invention relates to a system Large-Scale Integrated circuit (hereinafter referred to as "LSI") such as a system control circuit or system solution chip; a system Center Processing Unit (hereinafter referred to as "CPU"); a system Multi Processing Unit (hereinafter referred to as "MPU"); and the like.

2. Description of the Related Art

Conventional NVDRAMs are typically categorized into two types. One type includes a combination of a DRAM and a EEPROM. The other type employs a ferroelectric material.

The structure and operation of the DRAM and EEPROM combination type NVDRAMs are described in "A 256 K-bit Non-Volatile PSRAM with Page Recall and Chip Store", 1991 Sym. VLSI Circuit Dig. Tech. Papers, May, pp. 91–92, and in "Development of 256 K bit Non-Volatile DRAM (NV-DRAM) Operating as a Pseudo-SRAMR", Sharp Technical Journal, No. 49, pp. 45–49, June, 1991.

In a normal volatile (DRAM) operation, the DRAM and EPPROM combination type NVDRAM uses its DRAM for data access. In a store operation, immediately before the NVDRAM is turned off or at any time desired, data held in the DRAM is transferred to the EEPROM. In the recall operation, the data stored in the non-volatile state is transferred from the EEPROM to the DRAM.

As a result, a high-speed data access can be achieved by the DRAM in the normal DRAM operation while the data can be saved safely in the EEPROM in the absence of supplied power. The advantages of the combination type NVDRAM are that data can be retained separately in the DRAM and the EEPROM; and that there is no limitation to the number of times the recall operation can be repeated.

On the other hand, a ferroelectric type NVDRAM is described in (1) "An Experimental 512-bit Non-Volatile Memory with Ferroelectric Storage cell", IEEE Journal of Solid State Circuites, Vol. 23, pp. 1171–1175, October, 1988; (2) "A Ferroelectric DRAM Cell for High-Density NVRAM's", IEEE Electron Device Lett. Vol. 11, No. 10, pp. 454–456, October, 1990; and (3) Japanese Laid-Open Publication No. 4-42498, "A Semiconductor Memory Device, and a Method for Read/Write the Semiconductor Memory Device".

Article (1) describes a ferroelectric type NVDRAM as including memory cells each having two transistors and two capacitors (hereinafter this type of NVDRAM will be referred to as a two-transistor/cell NVDRAM). In the two-transistor/cell NVDRAM, a read/write operation is performed in a recall/store mode which involves polarization reversal of a ferroelectric thin film included in the memory cell. However, the two-transistor/cell NVDRAM cannot satisfy the required number of available polarization reversals ($10^{15}$ to $10^{16}$ times) of the ferroelectric thin film in order to achieve 10-year continuous operation with a cycle of 100 nsec. This is because the possible number of the available polarization reversals of the ferroelectric thin film is limited to $10^{12}$ to $10^{13}$ times at maximum under the preset situation. Article (2) discusses the difference in fatigue of the ferroelectric thin film operated during a volatile (DRAM) operation without the polarization reversal and during a non-volatile (recall/store) operation. It is reported that the fatigue of the ferroelectric thin film is significantly small during the volatile operation compared with during the non-volatile operation. Article (3) describes an example of a non-volatile semiconductor memory device including word lines selected by row addresses and plate lines and sense amplifiers selected by column addresses, realizing low power consumption and a short cycle.

The above-mentioned ferroelectric type NVDRAMs use memory cells each incorporating a capacitor element which has a thin film made of a ferroelectric material with a crystal structure of a perovskite type, e.g., Y1 (the common name of a ferroelectric ceramic which is less fatigued by a rewrite operation (polarization reversal)), PZT, PLZT, $PbTiO_3$, etc. Many kinds of ferroelectric materials have been vigorously developed in order to realize an ideal ferroelectric thin film which is not fatigued by the polarization reversal and which has a large remanent polarization and a large dielectric constant.

When an AC voltage is applied to the capacitor element including such a ferrroelectric thin film, the polarization of the ferroelectric thin film shows a hysteresis characteristic as shown in FIG. 11. As seen from FIG. 11, the polarization state of the ferroelectric material, which is at point A when it is not polarizaed, shifts to point B when a positive electric field is applied to the ferroelectric thin film. The polarization state of the ferroelectric thin film returns only to point C (instead of A) when the electric field is removed, thus resulting in a positive remanent polarization. This remanent polarization vanishes when a negative electric field is applied. By further increasing the intensity of the negative electric field, the polarization of the ferroelectric thin film is reversed so that the polarization state shifts to point D. The polarization state of the ferroelectric thin film returns only to point E when the electric field is again removed, thus resulting in a negative remanent polarization. Thus, by allowing the polarization of the ferroelectric thin film to be reversed so as to attain positive or negative remanent polarization, given data can be stored in a non-volatile manner. Moreover, by simply applying or removing a positive or negative electric field across the capacitor element, it can be ensured that the polarization state of the ferroelectric material of the capacitor element shifts only between points B and C or between points D and E, instead of having polarization reversals. Thus, given data can be stored in a volatile manner, as in the case of a usual DRAM.

The above-described ferroelectric NVDRAM has the advantage that, since the memory cells thereof can be constituted by a smaller number of elements than in the case of a combination type NVDRAM, the cell areas can be reduced, thereby providing for further integration of the device. The ferroelectric NVDRAM has another advantage of low power consumption.

Hereinafter, the structure and operation of an exemplary ferroelectric type NVDRAM, where two-transistor/cell memory cells are used, will be described. The two transistor/ cell memory cell is known to be immune to possible variations in the fabrication process.

As shown in FIG. 12, this ferroelectric type NVDRAM includes a plurality of word lines WL and corresponding plate lines PT. The word lines WL are connected to a word line decoder 31. The plate lines PT are connected to a plate decoder 32. The NVDRAM also includes a plurality of pairs of bit lines, bit and bit-bar. Each pair of bit lines, bit and bit-bar, are connected to a sense amplifier 33. In FIG. 12, only one pair of bit lines, bit and bit-bar, and their corresponding sense amplifier 33 are shown.

A memory cell 34 is provided in each portion where one of the word lines WL and its corresponding plate line PT intersect a pair of bit lines, bit and bit-bar. In FIG. 12, only one memory cell 34 is shown. The memory cell 34 includes two capacitor elements $C_1$ and $C_2$ and two selection transistors $Q_1$ and $Q_2$. One of the terminals of the capacitor element $C_1$ is connected to the bit line bit via the transistor $Q_1$. One of the terminals of the capacitor element $C_2$ is connected to the bit line bit-bar via the transistor $Q_2$. The other terminals of the capacitor elements $C_1$, and $C_2$ are connected to the plate line PT. Gates of the transistors $Q_1$ and $Q_2$ are connected to the word line WL.

The above-described ferroelectric type NVDRAM operates in the following manner. The word line decoder 31 and the plate line decoder 32 select, respectively, one of the word lines WL and one of the plate lines PT, in accordance with an address signal input to an address buffer 35. Then, the memory cell 34 is accessed in a mode chosen in accordance with a control signalinput from an NE bar pin (an enable pin for switching to a non-volatile mode), a CE-bar bin (an enable pin for selecting a chip), an OE-bar pin (an output enable pin), a WE-bar pin (a write enable pin) to a control signal input buffer 36. Specifically, the access operation to the memory cell 34 is conducted in one of the following modes: in a DRAM mode (or a volatile mode) for accessing data stored in a volatile state, the NVDRAM is controlled by a DRAM mode timing control circuit 37; in a recall mode for reading and rewriting data stored in a non-volatile state, the NVDRAM is controlled by a recall mode timing control circuit 38; in a store mode for writing data stored in a non-volatile state, the NVDRAM is controlled by a store mode timing control circuit 39. The inputting and outputting of the data to be accessed are conducted through a data I/O interface 40.

Hereinafter, a write operation in the store mode, controlled by the store-mode timing control circuit 39, will be described with reference to FIGS. 11 through 14. As shown in FIG. 13, when data "0" is to be written, for example, a voltage of 0 V and a voltage of 5 V (e.g., supply voltage $V_{cc}$) are applied to, respectively, the bit line bit and the bit line bit-bar, and a voltage pulse which varies from 0 V and 5 V and back to 0 V is applied to the plate line PT while keeping the word line WL in an active state. As a result, the polarization state of the ferroelectric material of the capacitor element $C_1$ shifts from point C or point E to point B, and then to point C as shown in FIG. 11. The polarization state of the ferroelectric material of the capacitor element $C_2$ shifts from point D to point E and back to point D as shown in FIG. 11. Accordingly, after application of these voltages is stopped, the ferroelectric materials of the capacitor elements $C_1$ and $C_2$ have the remanent polarizations of points C and E, respectively, so that the data '0 is stored in a nonvolatile manner.

When data "1" is to be written, as shown in FIG. 14, a voltage of 5 V and avoltage of 0 V are applied to, respectively, the bit line bit and the bit line bit-bar, in contrast to the voltages of 0 V and 5 V applied in the above-mentioned case of writing the data "0". A voltage pulse which varies from 0 V to 5 V and back to 0 V is applied to the plate line PT while keeping the word line WL in an active state, whereby the ferroelectric materials of the capacitor elements $C_1$ and $C_2$ are caused to have the remanent polarization of points E and C, respectively, so that the data "1" is stored in a non-volatile manner. Alternatively, a plurality of voltage pulses which, for example, vary from 0 V to 5 V to 0 V to 5 V to 0 V applied to the plate line PT, whereby obtaining a more reliable store operation.

Next, a read operation of data in the recall mode, controlled by the recall mode timing control circuit 38, will be described with reference to FIGS. 11, 12, and 15. In this operation, as shown in FIG. 15, the pair of bit lines bit and bit-bar are precharged at a potential of 0 V and thereafter are placed in an open state. Then, a voltage which varies from 0 V to 5 V is applied to the plate line PT while keeping the word line WL in an active state. As a result, in the case where data "0" is stored in the memory cell 34, the polarization state of the ferroelectric material of the capacitor element $C_1$ shifts from point C to point B as shown in FIG. 11, while the polarization state of the ferroelectric material of the capacitor element $C_2$ shifts from point E to point B. Thus, the polarization of the ferroelectric material of the capacitor $C_2$ is reversed, so that the potential of the bit line bit-bar, which is connected to the capacitor element $C_2$, becomes higher than that of the bit line bit by hundreds of mV (milivolts). Accordingly, by sensing the difference between the potentials of the bit lines bit and bit-bar by the sense amplifier 33, the data stored in a non-volatile manner can be read out.

However, the polarization states of the capacitor elements $C_1$ and $C_2$ both shift to point B, so that the data which has been stored in a non-volatile manner is lost, resulting in a destructive read-out of the data. Accordingly, in the recall mode, the data which has been recalled can be rewritten in the NVDRAM by storing the data in a non-volatile manner. This can be conducted by, after the pair of bit lines bit and bit-bar are set at 0 V and 5 V by the sense amplifier 33, applying a voltage which varies from 0 V to 5 V and back to 0 V to the plate line PT in the same procedure as that for the store mode. In addition, by maintaining the plate line PT at 0 V after the above procedure, the potentials set for the pair of bit lines bit and bit-bar can be stored in the memory cell 34 as charges, thus realizing storage in a DRAM mode (to be described later). The potential difference between the pair of bit lines bit and bit-bar which is generated in the recall-mode is in proportion to the intensity of the remanent polarization of the ferroelectric material and in inverse proportion to the bit line capacitance. Accordingly, a larger potential difference can be obtained as the remanent polarization increases and as the bit line capacity decreases, thereby facilitating the detection by the sense amplifier 33.

An access operation to the data in the DRAM mode, controlled by the DRAM-mode timing control circuit 37, is achieved by the same procedure as that for a conventional DRAM except that a voltage of 0 V or 5 V is applied to the plate line PT. Thus, the polarization states of the ferroelectric materials of the capacitor element $C_1$ and $C_2$ shift only between point D and point E or between point B and point C (FIG. 11), neither of which results in any polarization reversal. Therefore, the read and write of the data stored in a volatile manner can be conducted by utilizing the charges stored in the capacitor elements $C_1$ and $C_2$ alone, as in the case of a conventional DRAM. Refresh operations of the data can also be conducted.

Although a ferroelectric type NVDRAM using two transistor/cell memory cells was described above, substantially the same principle applies to a ferroelectric NVDRAM including a cell having one transistor and one capacitor (hereinafter this type of NVDRAM will be referred to as a one-transistor/cell NVDRAM), as disclosed in Japanese Laid-Open Publication No. 4-176589, which is suitable for a high integration. In addition, the same principle may be applied to NVDRAMs in which addresses are multiplexed and a row address strobe signal RAS-bar and a column address strobe signal CAS-bar are used, as in a usual case of a DRAM. Multiplexing the addresses has the advantage of reducing the number of terminal pins for the addresses so as to obtain a higher integration of the device.

It is possible to operate the combination type NVDRAM and the ferroelectric type NVDRAM both described above in the store mode for writing data in a non-volatile manner and in the recall mode for reading the data stored in the non-volatile manner. However, the operational speed of the ferroelectric NVDRAM is slower than that of the combination type NVDRAM by the polarization reversal time.

Moreover, in the case of the combination type NVDRAM, available times to rewrite the EEPROM are limited to about one hundred thousand times, so that the EEPROM will soon reach the end of its lifetime if frequent rewrite operations are conducted. For this reason, in the case of the combination type NVDRAM, the EEPROM is prevented from undergoing an excessively large number of rewrite operations by ensuring that only the DRAM is accessed during normal operations. Accordingly, the data stored in the DRAM is saved in the EEPROM only immediately before the NVDRAM device is turned off, and all the data is recalled into the DRAM in a recall mode when the NVDRAM device is turned on the next time.

In the case of the ferroelectric type NVDRAM, the ferroelectric materials included in the capacitor elements $C_1$ and $C_2$ permit only a limited number of polarization reversals so that the recall/store operations are limited to about $10^{10}$ to $10^{12}$ times. Therefore, the lifetime of the memory cells 34 can expire in a few days by conducting successive accessing at a frequency of about 10 MHz. The number of polarization reversals of the ferroelecric material needs to be about $10^{15}$ or more in order to obtain the 10-year continuous non-volatile operation (recall/store operation). To this end, the number of the access operations which result in polarization reversals is minimized by ensuring that access operations in the DRAM mode, which do not result in any polarization reversal, are conducted during normal read/write operations and that the data in the memory cells 34 is stored in a non-volatile manner only before the NVDRAM device is turned off. In the ferroelectric type NVDRAM device, all the data stored in the non-volatile state is recalled to the data stored in the volatile state in the first read operation when the NVDRAM device is turned on the next time. In addition, since the access operation in the DRAM mode does not require varying a voltage level of the plate line PT, the access operation in the DRAM mode has the advantages of shortening the cycle and reducing power consumption.

FIGS. 16 and 17 show structures of conventional NVDRAMs called FRAM (or FeRAM). These FRAMs include row decoders to receive row addresses via row address latches and column decoders to receive column addresses via column address latches. The row and column decodersareprovided around memory cell arrays. A memory cell is selected in accordance with an input address. The memory cell is then accessed in accordance with a mode based on control signals CE-bar, WE-bar, and OE-bar input to a control circuit. Data to be written or read to/from the memory cell is input to a column decoder or output to the outside via $I/O_0$ to $I/O_7$ by an I/O latch and an I/O buffer circuit.

For example, in the case of a parallel FRAM having a small capacity (4 Kbit) shown in FIG. 16, higher address pin terminals $A_3$ to $A_5$ are assigned to a row address while lower address pin terminals $A_0$ to $A_2$ are assigned to a column address. However, in the case of a parallel FRAM having a large capacity (64 Kbit) shown in FIG. 17, higher address pin terminals $A_3$ to $A_9$ and $A_{11}$ and $A_{12}$ are assigned to a row address while lower address pin terminals $A_0$ to $A_2$ and $A_{10}$ are assigned to a column address. In the case of the parallel FRAM having the large capacity (64 Kbit), the numbering of the address pin terminals is not serial.

Japanese Laid-Open Publication No. 7-13859 discloses volatile and non-volatile semiconductor memory devices having different capacities and widths of data bus and a controller for the devices. The controller reduces unnecessary power consumption due to penetration power, etc. as much as possible. However, this conventional technique suffers from a low operational speed of a semiconductor memory device since the number of operations of a non-volatile memory device is large.

As NVDRAMs, the combination type NVDRAM including a DRAM as a volatile data storage means and an EEPROM as a non-volatile data storage means, and the ferroelectric type NVDRAM including a memory cell having volatile and non-volatile storage capabilities are described above. In either type NVDRAM, if only the non-volatile (recall/store) operations are performed continuously, a 10-year operation cannot be guaranteed.

Further, in the conventional NVDRAMs, there are problems in that the recall/store operations are slow; data may be not protected; and the polarization is fatigued.

In the NVDRAMs, data stored in the non-volatile state is transformed to data in the volatile state in the recall operation while data stored in the volatile state is transformed to data in the non-volatile state in the store operation. In the non-volatile (recall/store) operations, the polarization reversal of the ferroelectric material occurs, leading to the longer operation time as compared with during the volatile (DRAM) operation. Therefore, when the NVDRAM is operated in the non-volatile (recall/store) operations, there is a problem in that the read and write speeds are slow. There is also a problem in that a system noise or the like upon power-on or power-off may cause an erroneous rewrite operation which unexpectedly changes non-volatile data. The ferroelectric materials are fatigued after data rewrite operations utilizing the polarization reversal are repeated about $10^{10}$ to $10^{12}$ times. If the device is operated at a cycle of 100 nsec, a 10-year successive access operations to the memory cell cannot be guaranteed.

Further, when the NVDRAM has a large memory capacity, the refresh operation of the conventional volatile DRAMs increases power consumption.

The above-described problems are common to the case where the NVDRAM is implemented as a memory cell device solely; the case where the NVDRAM is implemented as a memory module or register for a single chip microcomputer (MPU or CPU); the case where the NVDRAM is incorporated into a system in the form of a card, and the like.

In the store operation of the combination type NVDRAM, a Fowler-Nordheim tunnel current flows through the EEPROM, requiring an additional time as compared with the volatile (DRAM) operation. Therefore, the write speed is slow. Moreover, the number of rewrite operations is limited to about one hundred thousand times for the EEPROM. The EEPROM will soon reach the end of its lifetime if frequent rewrite operation are conducted. A 10-year successive access operation thus cannot be guaranteed.

SUMMARY OF THE INVENTION

According to one aspect of the present invention, a non-volatile semiconductor memory device includes a memory cell array including memory cells capable of storing data in a volatile state and in a non-volatile state. The memory cells are arranged in a matrix. The non-volatile semiconductor memory device further includes a row address determination circuit for determining whether a row address in a current cycle is the same as a row address in a previous cycle when an activating signal for activating a read cycle for reading data stored in the memory cell or a write cycle for writing data into the memory cell is received. When the row address in the current cycle is different from the row address in the previous cycle, a store operation is performed with respect to the memory cell selected in the previous cycle, where volatile data is stored in the memory cell as non-volatile data; thereafter, a recall operation is performed where non-volatile data stored in the memory cell selected in the current cycle is transformed into volatile data; and the resulting volatile data is stored in the memory cell and a sense amplifier connected to a corresponding column address, or at least one of the sense amplifier and a latch circuit. When the row address in the current cycle is the same as the row address in the previous cycle, a read or write operation is performed with respect to volatile data stored in the memory cell, or the sense amplifier or latch circuit connected to a corresponding column address, but non-volatile data is not read from or written to the memory cell.

In one embodiment of this invention, when the read operation is performed immediately after power-on, a reset signal changing upon power-on or a reset signal inside the device is used in the recall operation.

In one embodiment of this invention, upon power-off or reset, a reset signal changing upon power-off or reset, or a reset signal inside the device is used in the store operation.

In one embodiment of this invention, the column address is assigned to lower address pin terminals, and the row address is assigned to higher address pin terminals; and an external address is input.

In one embodiment of this invention, each memory cell includes a combination of a DRAM as a volatile data storage means and an EEPROM as a non-volatile data storage means.

In one embodiment of this invention, each memory cell is made of a ferroelecric material; and data is stored in a non-volatile state in each memory cell using polarization reversal and data is stored in a volatile state in each memory cell without using the polarization reversal.

In one embodiment of this invention, the device is controlled in such a way that a driving signal for driving a word line connected to the memory cell is in the enable state during a period of time from the start of the recall operation to the end of the store operation.

In one embodiment of this invention, the device is controlled in such a way that a driving signal for driving a word line connected to each memory cell is in the enable state only during the recall operation and the store operation.

In one embodiment of this invention, the store operation is initiated after the recall operation is completed.

In one embodiment of this invention, the read or write cycle is performed in synchronization with an external synchronization signal.

In one embodiment of this invention, the non-volatile semiconductor memory device further includes a circuit for generating a WAIT signal, wherein the WAIT signal is inactive during the recall operation and the store operation.

In one embodiment of this invention, the non-volatile semiconductor memory device further includes a latch circuit for latching a row address at least during the read cycle and the write cycle.

According to another aspect of the present invention, a system LSI includes the non-volatile semiconductor memory device.

Hereinafter, functions of the present invention will be descried.

As NVDRAMS, the combination type NVDRAM including a DRAM as a volatile data storage means and an EEPROM as a non-volatile data storage means, and the ferroelectric type NVDRAM including a memory cell having volatile and non-volatile storage capabilities are described above. In either type NVDRAM, a memory cell has volatile and non-volatile data storage capabilities.

According to the present invention, in the NVDRAMs, when an activation signal is input f or activating a read cycle of reading data stored in a memory cell or a write cycle of writing data into the memory cell, the row address determination circuit determines whether a row address (word line address) input in a current read/write cycle is the same as a row address input in the previous read/write cycle.

When the row addresses differ from each other between the current and previous cycles, the store operation Is performed for a memory cell which has been selected by a row address in the previous cycle, where data stored in the volatile state is transformed into data stored in the non-volatile state. Thereafter, the recall operation is performed for a memory cell which is selected by a row address in the current cycle, where data stored in the memory cell in the non-volatile state is transformed into data in the volatile state for the purpose of reading. The obtained data stored in the memory cell in the volatile state is also stored in a sense amplifier connected to a column address corresponding to the memory cell. In either case of the ferroelectric type NVDRAM or the combination type NVDRAM, data may be stored only in the sense amplifier. Alternatively, data may be transferred and stored in the latch circuit rather than the sense amplifier. Alternatively, data may be stored in both the sense amplifier and the latch circuit. Data is stored in the volatile state in this way, thereby making it possible to reduce consumption of the polarization reversal. In the case of the combination type NVDRAM, the number of rewrite operations can be reduced. Further, the sense amplifier or the latch circuit includes a circuit which compensates a leakage current. Therefore, when data is stored in the volatile state in the sense amplifier or the latch circuit, the refresh operation which is performed in the conventional volatile DRAM is not required, thereby reducing power consumption.

When a row address selected in the current cycle is the same as a row address selected in the previous cycle, the read/write operations are performed with respect to data stored in the volatile state in a memory cell or a sense amplifier or latch circuit connected to a column address corresponding to the memory cell. In this case, the data stored in the non-volatile state is not read from or written to the memory cell. When the write operation is performed with respect to external data, if this operation is performed on the data stored in the volatile state in the sense amplifier or the latch circuit, the refresh operation which is performed in the conventional volatile DRAM is not required, thereby reducing power consumption. Further, when a column address selected in the current cycle is the same as a column address selected in the previous cycle, an operation requiring the polarization reversal (non-volatile operation) is not performed, so that the read speed is increased. Moreover, an SRAM having a small capacity can be omitted, thereby reducing cost. In the case of the combination type NVDRAM, the rewrite operation which causes the tunnel current is not performed, thereby increasing the rewrite speed.

When a device or system is turned on (powered on), a previous address is not specified. In this case, the recall operation can be controlled utilizing a reset signal which changes upon power-on (e.g., a system reset signal, or a reset signal within the device). Upon power-off, or when the system is reset, the store operation can be performed utilizing a reset signal which changes upon power-off or system reset (e.g., a system reset signal, or a reset signal within the device). At that point, by utilizing the system reset signal which inactivates the whole system, an erroneous write operation due to noise can be prevented.

For example, as will be described in the Examples, when the CE-bar (or the RAS-bar in the case of the address multiplex type) is activated (active state "LOW") after power-on, the recall operation is performed with respect to a memory cell provided along a word line selected by a current row address. The resulting data obtained is then stored in the memory cell and a sense amplifier connected to the corresponding column address. Alternatively, the data may be stored in a latch circuit, or both in the sense amplifier and in the latch circuit. When a row address in a current cycle is the same as a row address in the previous cycle (a CEin-bar signal keeps the active ("LOW") state), the read/write operation is performed with respect to data stored in the sense amplifier or the latch circuit connected to the corresponding column address. When a row address in a current cycle is different from a row address in the previous cycle (a CEin-bar signal keeps the inactive ("HIGH") state), the store operation is performed with respect to data stored in the volatile state in the sense amplifier or the latch circuit is stored as data in the non-volatile state.

Whereas in the conventional NVDRAMs the recall operation is performed with respect to a memory cell using an NE (Non-Volatile Enable)-bar signal which enables a non-volatile operation, the recall operation is performed with respect to a memory cell selected by a row address when the CE-bar signal (or the RAS-bar signal in the case of the address multiplex type) is active ("LOW") so that data is stored in the volatile state in a sense amplifier or the like which does not require the refresh operation and the other memory cells are used in the non-volatile manner which does not require the refresh operation. Thus, the refresh operation is not required for data stored in the volatile state, thereby reducing unnecessary power consumption. The CE-bar signal (or the RAS-bar signal) also serves as the NE-bar signal, so that a user does not recognize the NE-bar signal. Therefore, the NVDRAM of the present invention can be used in a way similar to that of the conventional volatile DRAMs, analogous SRAMs, or SRAMS, thereby obtaining satisfactory usability.

Further, the column address may be assigned to lower address pin terminals ($A_0$-) and the row address may be assigned to higher address pin terminals. The address pin terminals are selected in ascending order from the lower address. This allows satisfactory compatibility with a system CPU and a control circuit, thereby obtaining satisfactory usability.

Typically, the number of column addresses having the same row address is about 100 to about 1000. The present invention is particularly effective to the case where data stored at serial addresses (e.g., file memory) are used. For example, the number of available polarization reversals ($10^{12}$ to $10^{13}$) is multiplied by the number of the column addresses (100 to 1000), for exampe, 1000. The result is $10^{15}$ to $10^{16}$ which corresponds to the number of rewrite operations. The 10-year continuous operation (with a cycle of 100 nsec) can be achieved. In this case, the present invention is particularly effective when the column address is assigned to lower address pin terminals ($A_0$-) and the row address is assigned to higher address pin terminals.

The NVDRAM of the present invention may be controlled in such a way that the driving signal (row decoder control signal) for driving a word line connected to a memory cell is in. the enable state ("HIGH") during the period of time from the start of the recall operation to the end of the store operation. In this case, the circuit for generating the control signal can be simplified. Alternatively, the NVDRAM of the present invention may be controlled in such a way that the driving signal (row decoder control signal) for driving a word line connected to a memory cell is in the enable state only during the recall operation and the store operation. In this case, the driving signal is in the form of pulses, thereby reducing power consumption.

When the store operation is controlled upon power-off using a reset signal which changes upon power-off or system reset (e.g., a system reset signal or a reset signal within a device), the store operation can be initiated after the recall operation is completely ended so that data is not destroyed during the recall operation. An example of the reset signal within a device is a POWERGOOD signal.

Further, as in a synchronous system or a burst system, the read/write operations may be performed in synchronization with a synchronization signal from an external control system or the like. In this case, the synchronization signal can be utilized for the delay circuit so that the delay circuit can be simplified, thereby reducing variation in delay time.

A circuit for generating a WAIT signal may be provided so that the CPU or the control circuit can be in the inactive state ("LOW") during the recall/store operations to keep the read/write states during the recall/store operations.

A row address may be latched when the CE-bar signal for controlling the read/write cycles is in the active state (active="LOW"). This allows further prevention of an erroneous write operation due to noise or the like. The latching of a row address in such a period of time leads to prevention of an erroneous operation due to noise even when an input row address fluctuates due to noise, because the row address has already been latched inside the device.

Thus, the invention described herein makes possible the advantages of providing an NVDRAM and a system LSI which have high-speed recall/store operations and reduced power consumption and in which a 10-year continuous operation can be guaranteed.

These and other advantages of the present invention will become apparent to those skilled in the art upon reading and understanding the following detailed description with reference to the accompanying figures.

BRIEF DESCRIPTION OF THE DRAWINGS

FIG. 13 is a diagram for explaining an operation in which data "0" is stored in the memory cell including the ferroelectric material in the store mode.

FIG. 14 is a diagram for explaining an operation in which data "1" is stored in the memory cell including the ferroelectric material in the store mode.

FIG. 15 is a diagram for explaining an operation in which data is read out from the memory cell including the ferroelectric material in the recall mode.

DESCRIPTION OF THE PREFERRED EMBODIMENTS

Hereinafter, embodiments of the present invention will be described with reference to the accompanying drawings. In the following embodiments, although NVDRAMs including a memory cell made of a ferroelectric material will be described, the NVDRAMs may be incorporated into a so-called system LSI or microprocessor unit (MPU) as a memory. The NVDRAMs may be used as a single memory device or a memory device for a one-chip microcomputer. Further, the NVDRAMs may be incorporated into a multi-chip module or the like which includes a plurality of devices, such as IC cards or PC cards which are standardized by the Personal Computer Memory Card International Association (PCMCIA) or the Japan Electronic Industry Development Association (JEIDA).

Figure 12:
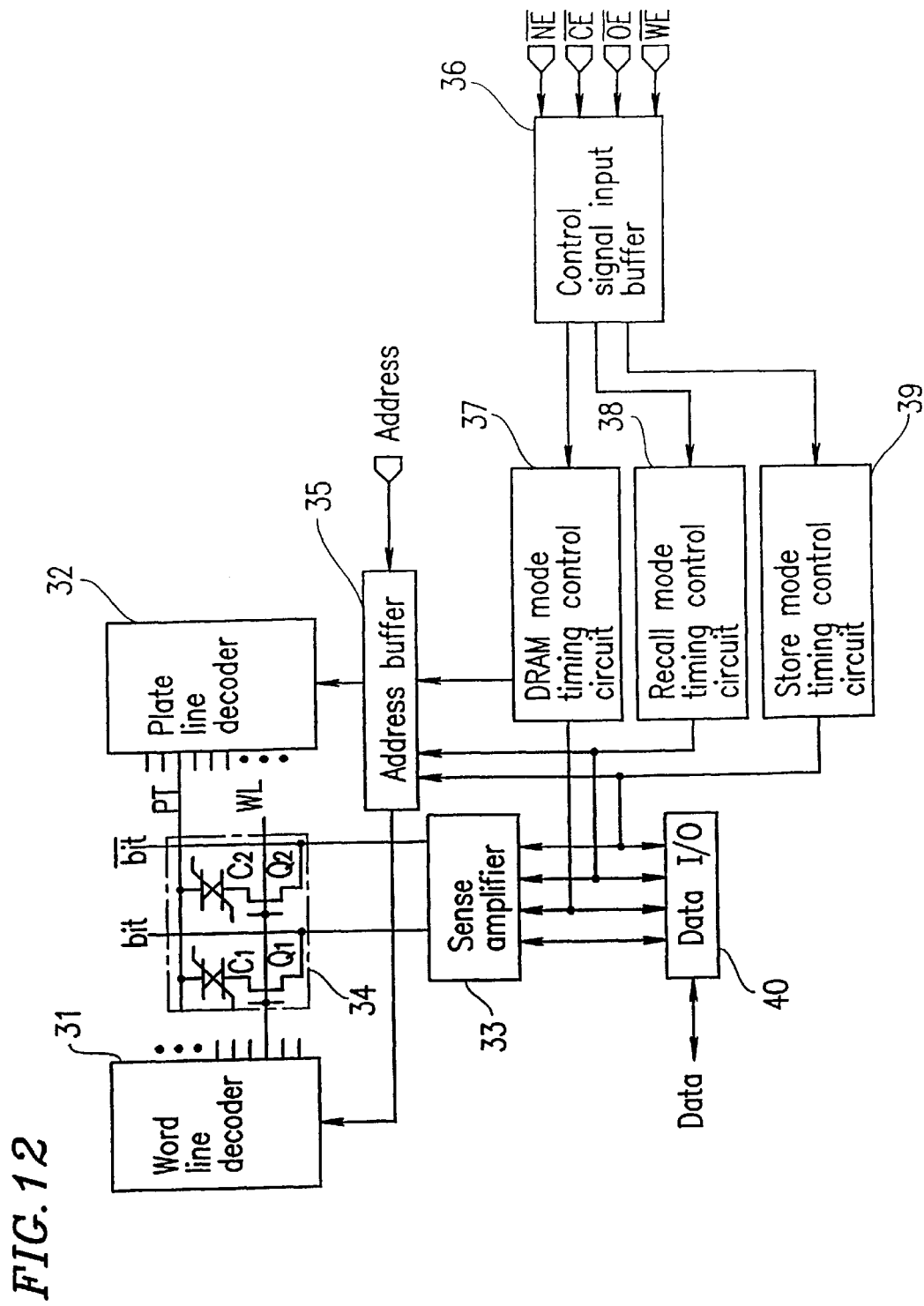
FIG. 12 is a block diagram showing a configuration of a conventional NDVRAM including a memory cell including a ferroelectric material.
Figure 16:
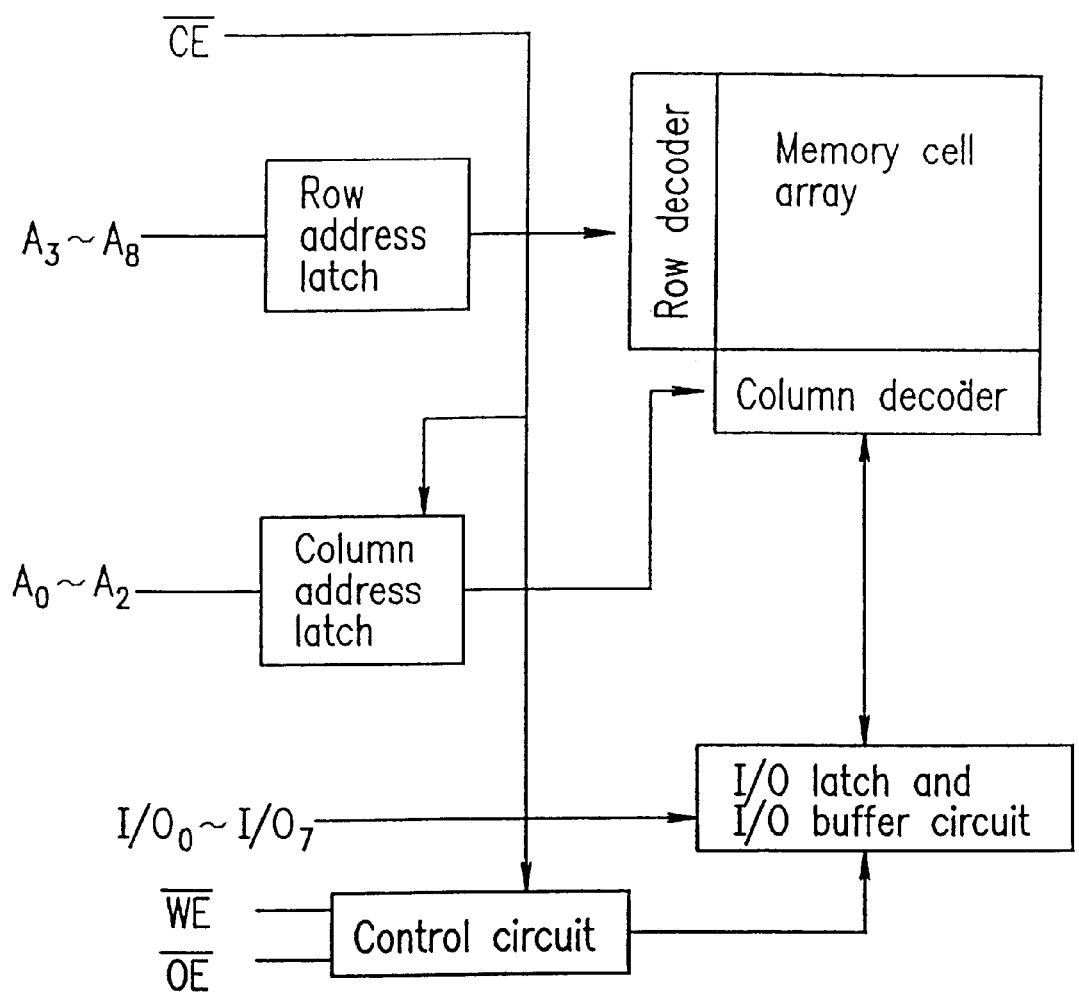
FIG. 16 is a block diagram showing an example of a conventional NVDRAM.
Figure 17:
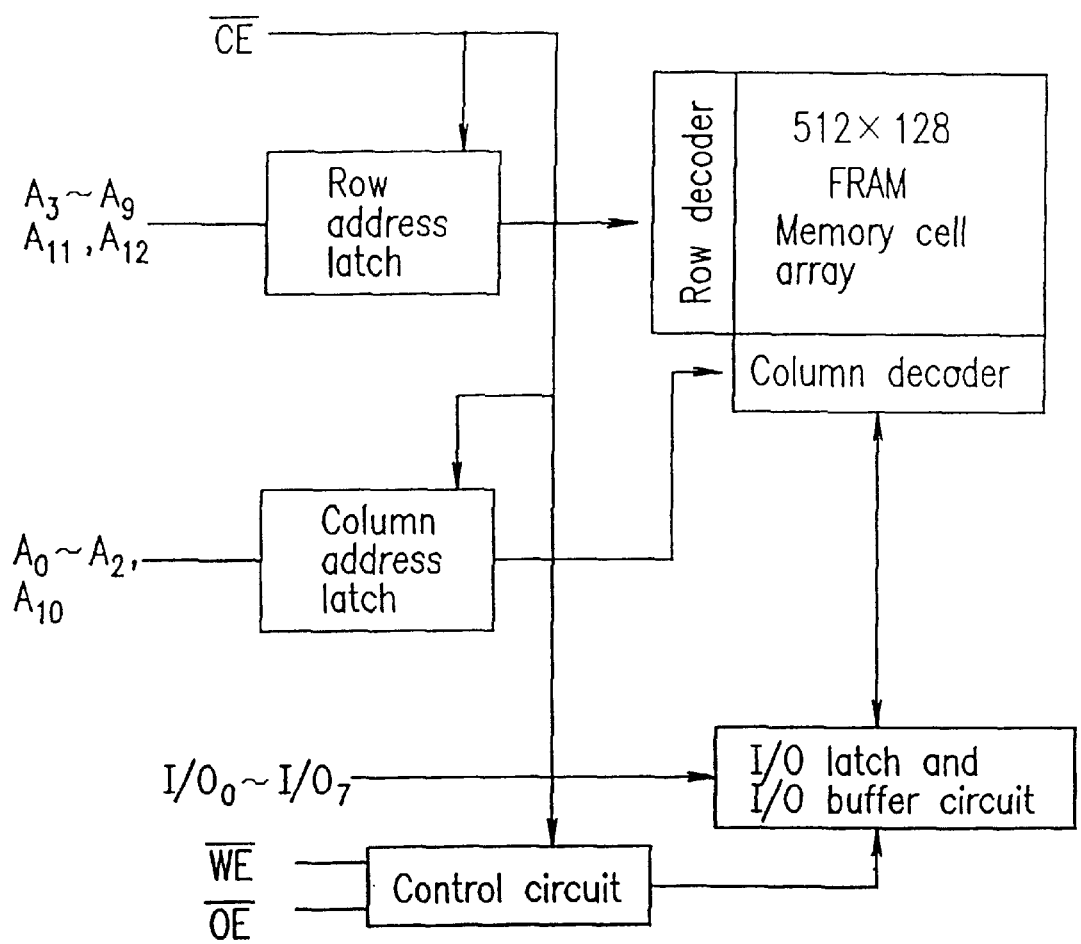
FIG. 17 is a block diagram showing another example of a conventional NVDRAM.
Figure 18:
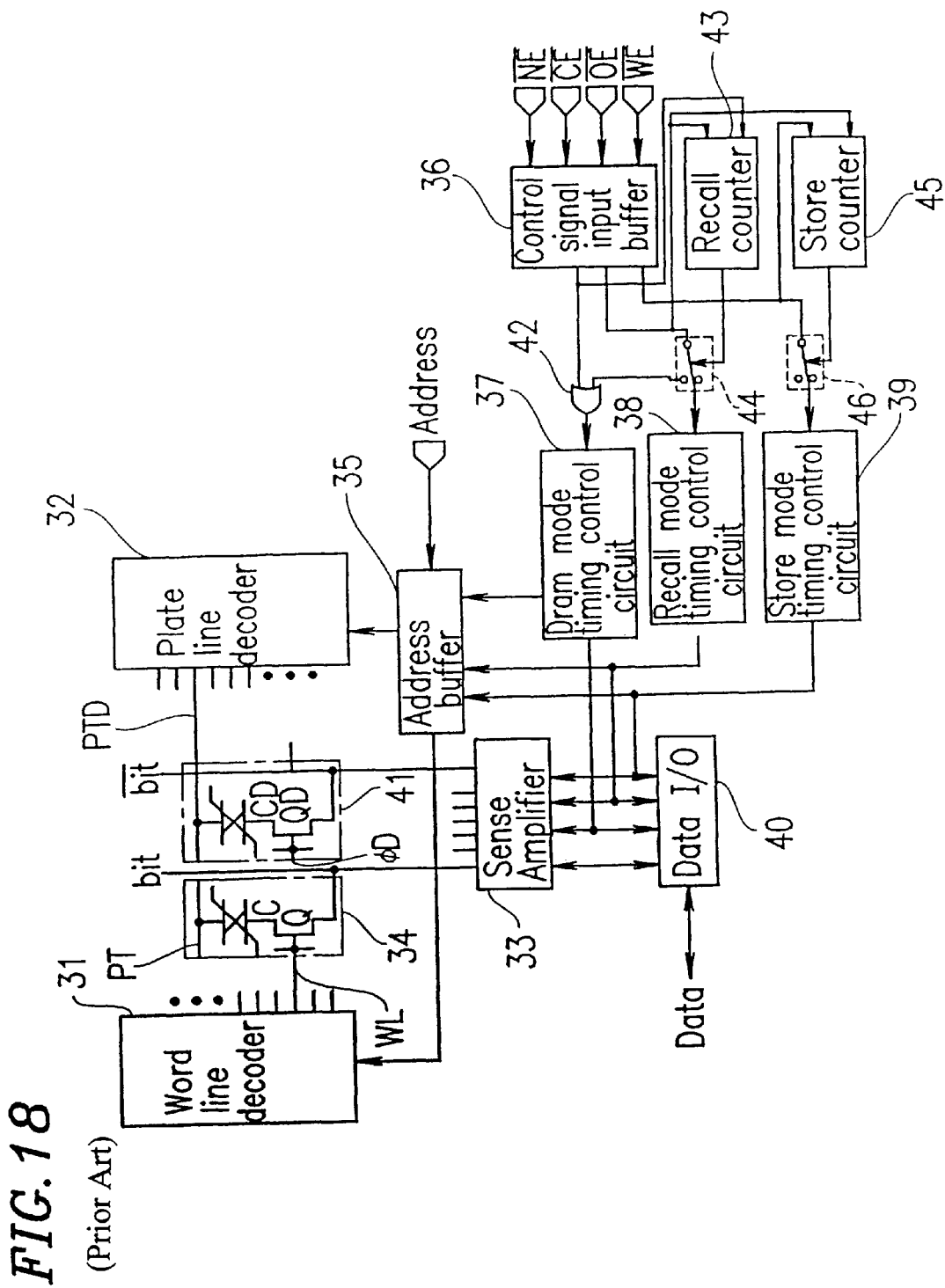
FIG. 18 is a block diagram showing an example of a conventional ferroelectric type NVDRAM.

In the NVDRAMs of the present invention, a memory cell array may include a number of two-transistor/cell type memory cells shown in FIG. 12 which are immune to possible variations in the fabrication process. Alternatively, the memory cell array may include a number of one-transistor/cell type memory cells shown in FIG. 18 which are suitable for a higher degree of integration. The NVDRAM shown in FIG. 18 includes a dummy cell 41, an OR gate 42, a recall counter 43 for counting the number of recall operations, a switch 44 which performs ON/OFF switching for a recall operation when an extraordinary number of recall operations exceeding a predetermined number are successively input, a store counter 45 for counting the number of store operations, and a switch 46 which performs ON/OFF switching for a store operation when an extraordinary number of store operations exceeding a predetermined number are successively input.

Figure 19:
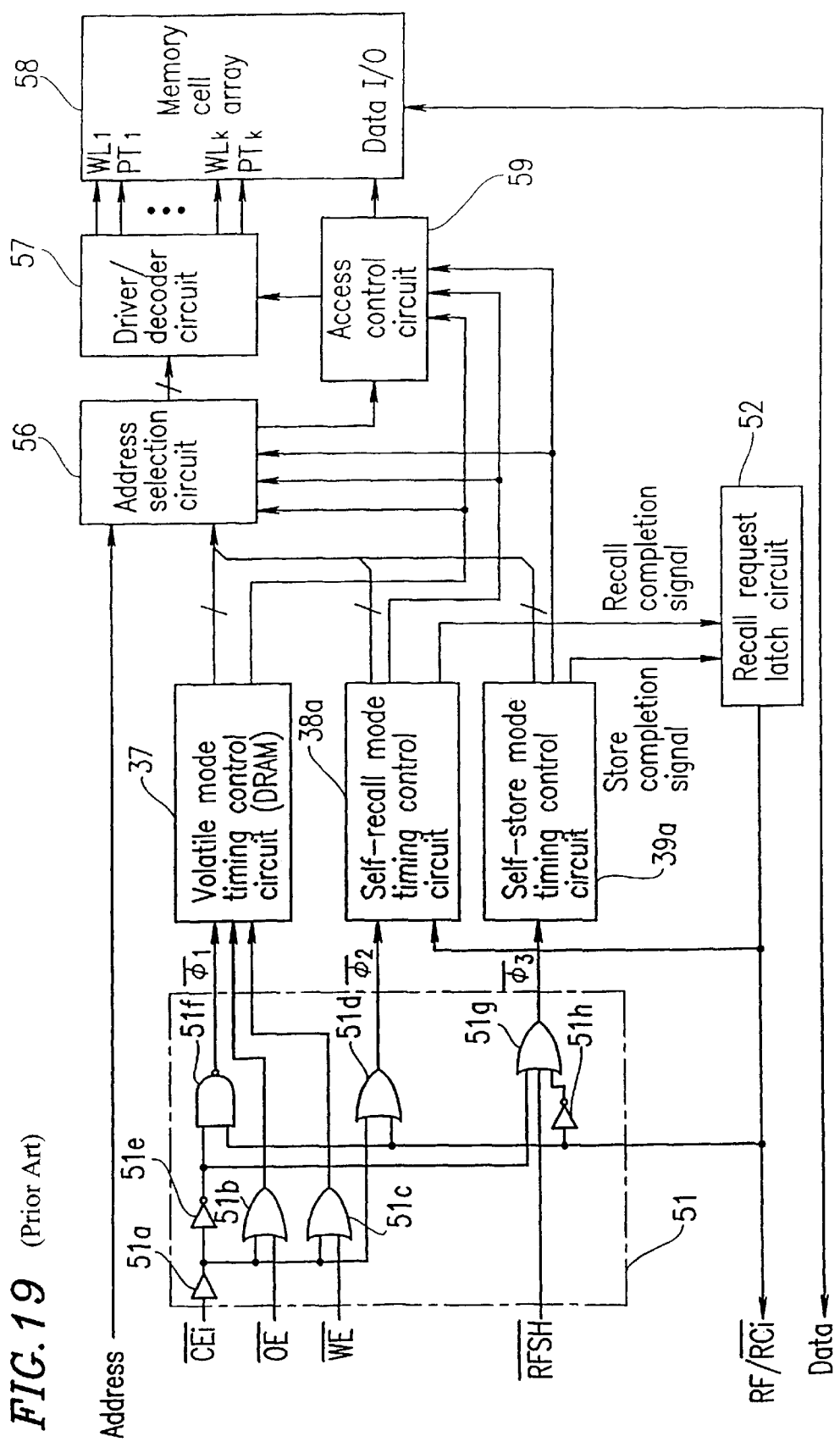
FIG. 19 is a block diagram showing another example of a conventional NVDRAM.

Alternatively, as shown in FIG. 19, the NVDRAM may not include the NE-bar signal as a control signal. The NVDRAM shown in FIG. 19 includes a circuit 51 for generating φ1-bar, φ2-bar, and φ3-bar signals, logic gates 51a through 51h, a recall request latch circuit for receiving a recall completion signal from a self-recall mode timing control circuit 38a and a store completion signal from a self-store mode timing control circuit 39a, an address selection circuit 56 for selecting an external address or internal address, a driver/decoder circuit 57 for selecting and driving a WL line and a PT line, a memory cell array 58, and an access control circuit 59 for controlling the driver/decoder circuit 57 and the memory cell array. In FIG. 19, a CEi-bar indicates an i-th chip enable signal; an RFSH-bar indicates a refresh enable signal; an RF/RCi-bar indicates an i-th RE/RC-bar signal which indicates that a volatile operation is being performed when RF/RCi-bar="THIGH"; and φ1-bar, φ2-bar, and φ3-bar indicate signals for controlling the timing control circuits 37, 38a, and 39a, respectively.

The self-recall mode timing control circuit 38a and the self-store mode timing control circuit 39a each include an internal address counter circuit and perform recall/store operations with respect to addresses in accordance with the internal addresses but not with external addresses.

Further, the present invention can also be implemented in the NVDRAMs including a DRAM as a volatile data storage means and an EEPROM as a non-volatile data storage means.

Figure 1:
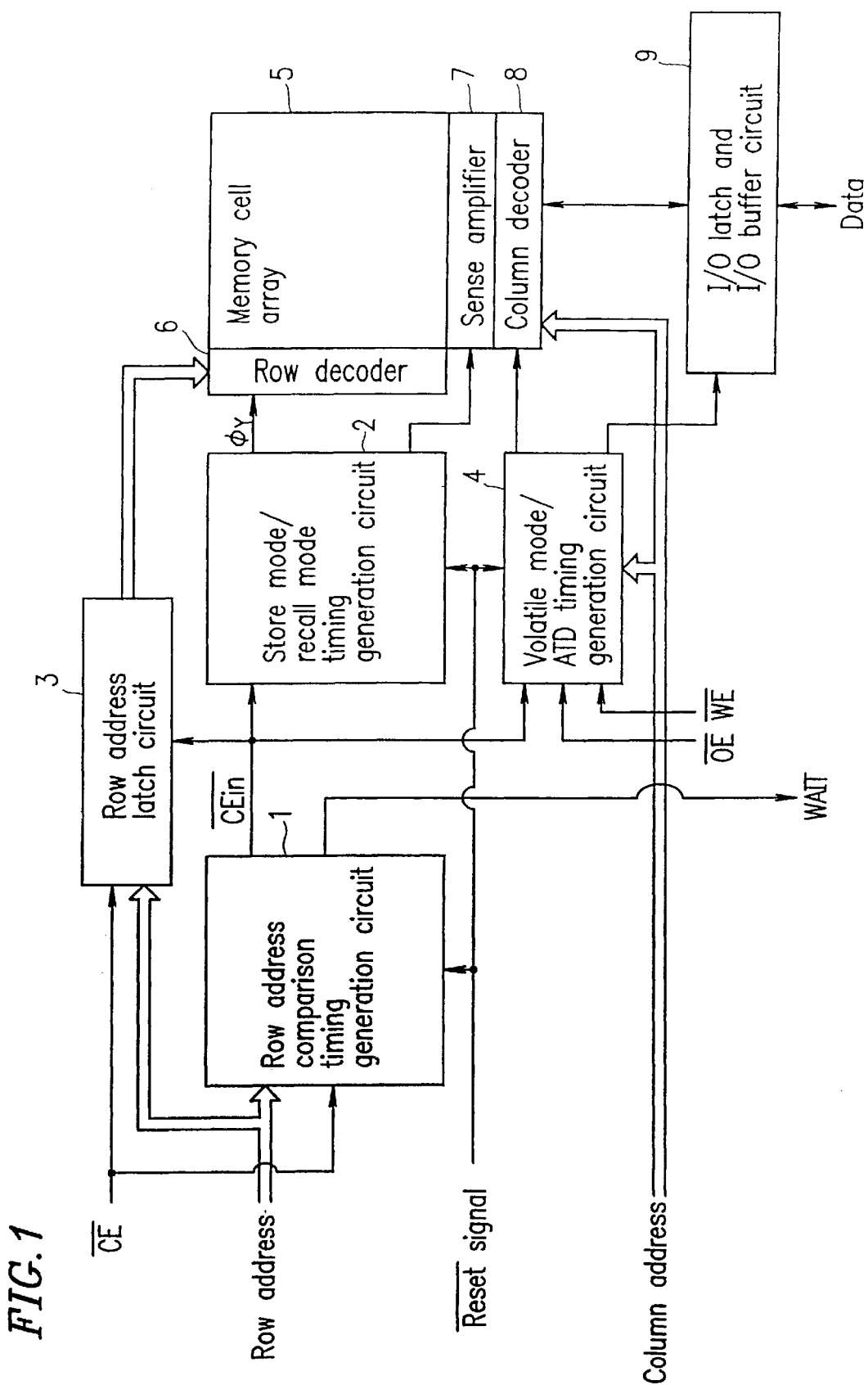
FIG. 1 is a block diagram showing an example of an NVDRAM according to the present invention.

FIG. 1 is a block diagram showing a configuration of an NVDRAM according to an embodiment of the present invention. The NVDRAM includes a row address comparison/timing generation circuit 1, a store mode/recall mode timing generation circuit 2, a row address latch circuit 3, a volatile mode/address transition detection (ATD) timing generation circuit 4, a memory cell array 5, a row decoder 6, a sense amplifier 7, a column decoder 8, and an I/O latch and I/O output buffer circuit 9. Although the NVDRAM herein includes the volatile mode/address transition detection (ATD) timing generation circuit 4 which performs a read operation in synchronization with transition of addresses, the NVDRAM may include a so-called burst mode read circuit which can perform a read operation in synchronization with an external clock signal instead of an address signal.

In the NVDRAM, when the chip selection signal CE-bar transits from an inactive (non-selection) state to an active (selection) state, a read (recall) operation in which data stored in the non-volatile state is transformed to data stored in the volatile state is performed with respect to a memory cell selected by the corresponding row address. When the row address in the previous read/write cycle in the volatile mode is the same as the row address (word line address) in the current read/write cycle, the row address comparison/timing generation circuit 1 holds the CEin-bar signal in the "LOW" state (chip selection state). Thereafter, volatile data is read from or written to a sense amplifier connected to the corresponding column address. Non-volatile data is not read from a memory cell, and is not written to a memory cell. Therefore, the number of polarization reversals can be reduced. Moreover, when the volatile data is stored in the sense amplifier, the refresh operation is not required. When the volatile data is stored in the memory cell, the refresh operation is required, as the case of the conventional volatile DRAM.

When the row address in the previous read/write cycle in the volatile mode is different from the row address (word line address) in the current read/write cycle, the row address comparison/timing generation circuit 1 changes the CEin-bar signal from "LOW" to "HIGH" (from the chip selection state to the chip non-selection state). When the chip selection state changesto the chip non-selection state in this way, the store operation is performed with respect to a memory cell which has been selected by a row address in the previous cycle so that volatile data is transformed to non-volatile data. Thereafter, the CEin-bar changes from the non-selection state to the selection state, so that the recall operation is performed with respect to a memory cell selected by a row address in the current cycle. These recall and store operations can be performed in a way similar to that of the conventional NVDRAMs. It is here assumed that which address pin or layout lead line a row address (word line address) corresponds to is typically predetermined in accordance with a data sheet or circuit diagram. The volatile data obtained by the recall operation is stored in a sense amplifier connected to the corresponding column address. In this case, the refresh operation is not required. When volatile data is stored in a memory cell, the refresh operation is required.

The OE-barsignal is an output enable signal. The WE-bar signal is a write enable signal.

In the burst mode read/write type NVDRAM, a volatile mode/burst timing generation circuit is provided instead of the volatile mode/ATD (address transition detection) timing generation circuit 4. The volatile mode/burst timing generation circuit controls the data read/write operations with respect to a column address selected by the column address counter circuit which counts in accordance with an external synchronization signal.

Figure 2:
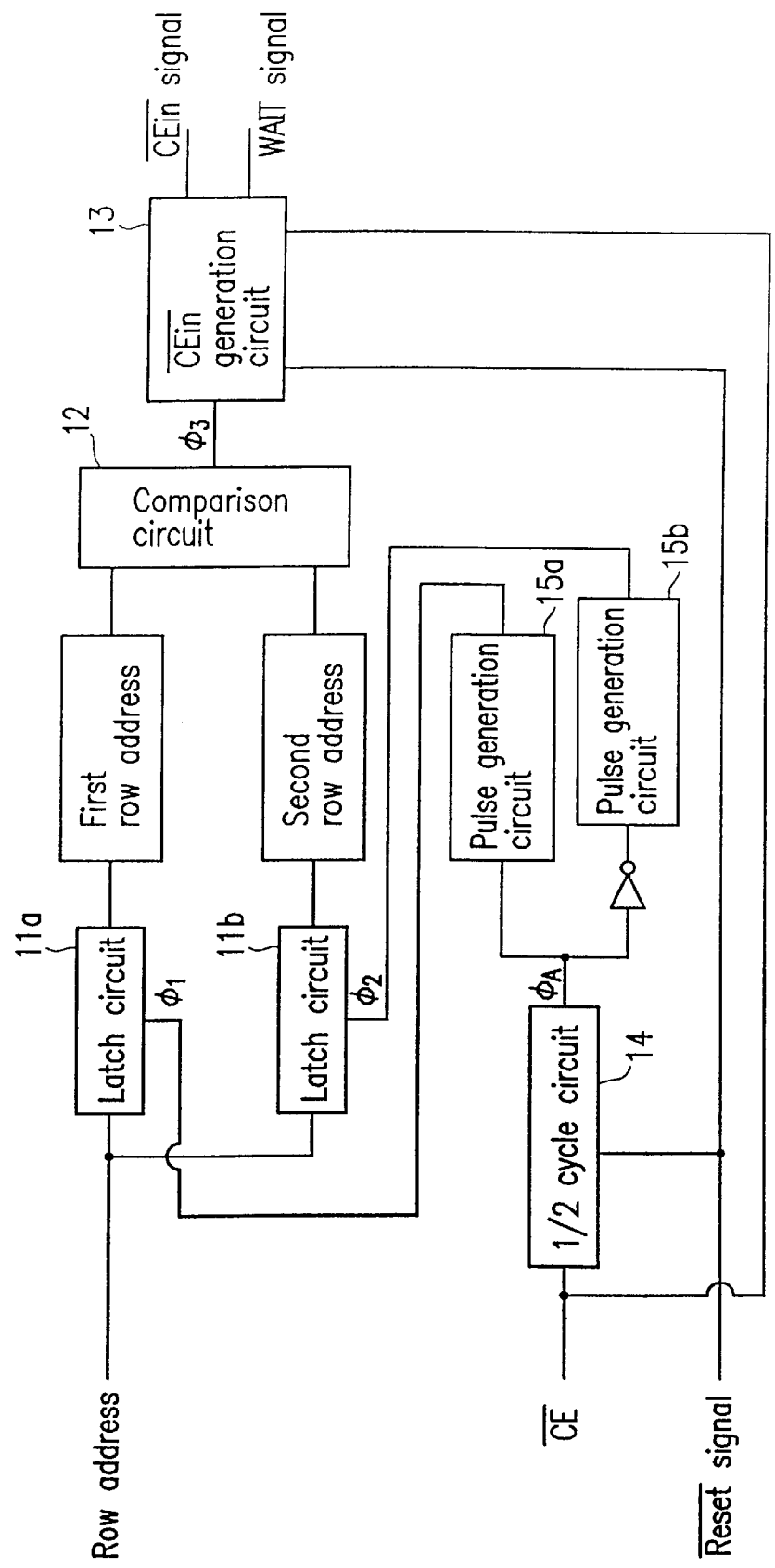
FIG. 2 is a block diagram showing a configuration of a row address comparison/timing generation circuit used in the present invention.

FIG. 2 is a block diagram showing a configuration of the row address comparison/timing generation circuit 1. The row address comparison/timing generation circuit 1 includes a latch circuit 11a for latching a first row address, a latch circuit 11b for latching a second row address, a comparison circuit 12 for comparing two row addresses, a CEin-bar generation circuit 13, a ½ cycle circuit 14 and pulse generation circuits 15a and 15b. The pulse generation circuits 15a and 15b generate latch control signals $\phi1$ and $\phi2$ at the odd-numbered falling and even-numbered falling of the control signal CE-bar, respectively. A row address externally input is latched as a first row address by the latch circuit 11b in accordance with the latch control signal $\phi2$. A row address externally input is latched as a second row address by the latch circuit 11b in accordance with the latch control signal $\phi2$. The comparison circuit 12 compares the first address and the second address bit by bit. When the first and second addresses are the same, the output $\phi3$ is "HIGH". When the first and second addresses differ from each other, the output $\phi3$ is "LOW".

Figure 3:
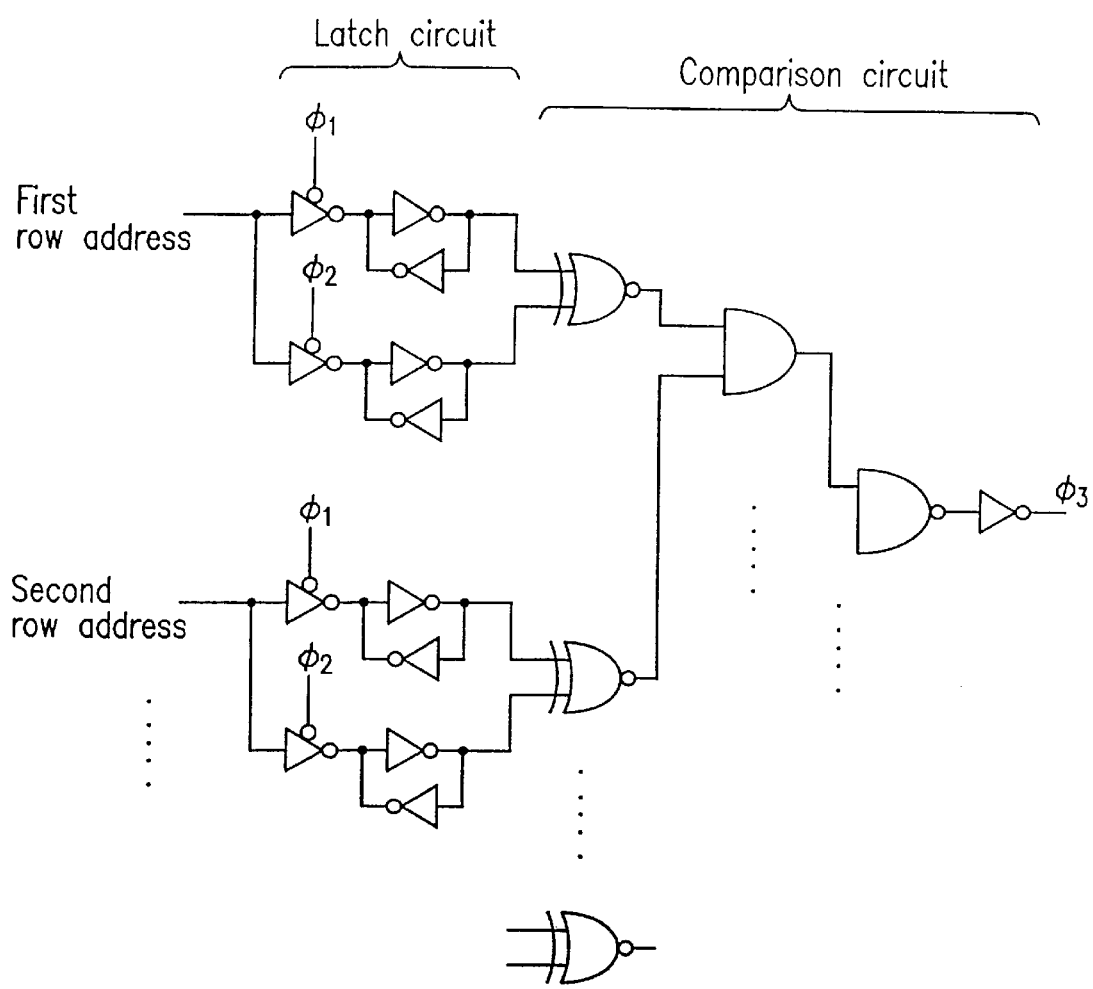
FIG. 3 is a circuit diagram showing an example of a latch circuits for latching a row address and a comparison circuit used in the present invention.

FIG. 3 is a circuit diagram showing an example of the latch circuits 11a and 11b for latching the row address and the comparison circuit 12. The comparison circuit 12 compares the first address and the second address bit by bit. When the first and second addresses are the same, the output $\phi3$ is "HIGH". When the first and second addresses differ from each other, the output $\phi3$ is "LOW".

Figure 4A:
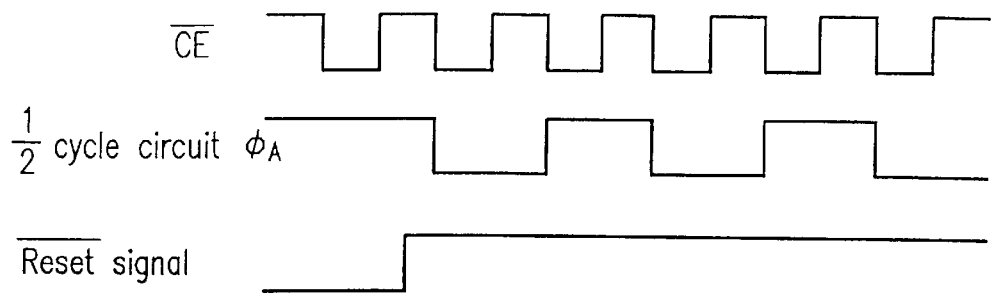
FIG. 4A is a timing chart for explaining the operation of a ½ cycle circuit used in the present invention.
Figure 4B:
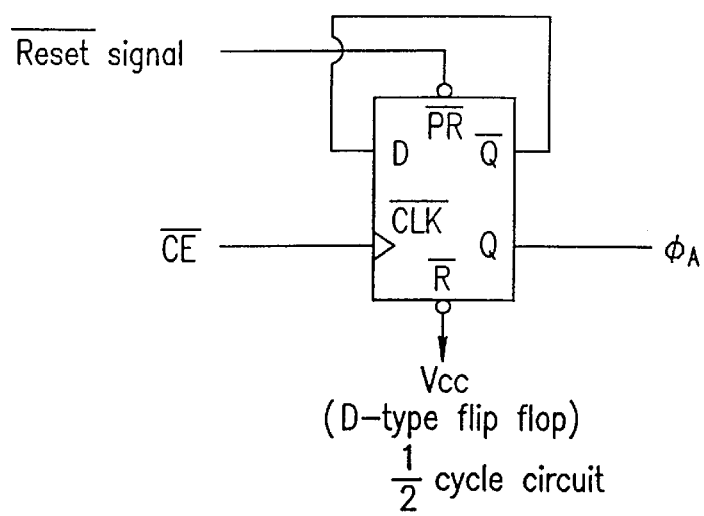
FIG. 4B is a circuit diagram showing an example of the ½ cycle circuit.
Figure 4C:
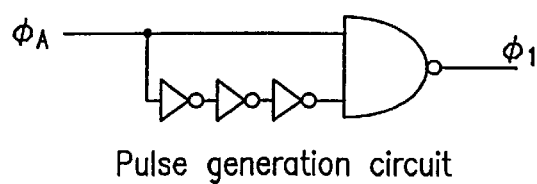
FIG. 4C is a circuit diagram showing an example of a pulse generation circuit which outputs the φ1, the circuit used in the present invention.

FIG. 4A is a timing chart for explaining the operation of the ½ cycle circuit 14. FIG. 4B is a circuit diagram showing an example of the ½ cycle circuit 14. FIG. 4C is a circuit diagram showing an example of the pulse generation circuit 15a which outputs the $\phi1$. The pulse generation circuit 15b which outputs the $\phi2$ has a structure similar to that of the pulse generation circuit 15a, and receives an inverse signal of $\phi A$. The ½ cycle circuit 14 includes a D-type flip flop, which the output $\phi A$ is preset to "HIGH" when a reset-bar signal is in the "LOW" state. A reset-bar terminal of the ½ cycle circuit 14 is connected to Vcc. The output $\phi A$ from the ½ cycle circuit 14 is changed from "HIGH" to "LOW" or from "LOW" to "HIGH", every time an input CE-bar signal changes from "HIGH" to "LOW". The pulse generation circuit 15a outputs the $\phi1$ having one pulse of "LOW" when the input $\phi A$ changes from "LOW" to "HIGH".

Figure 5:
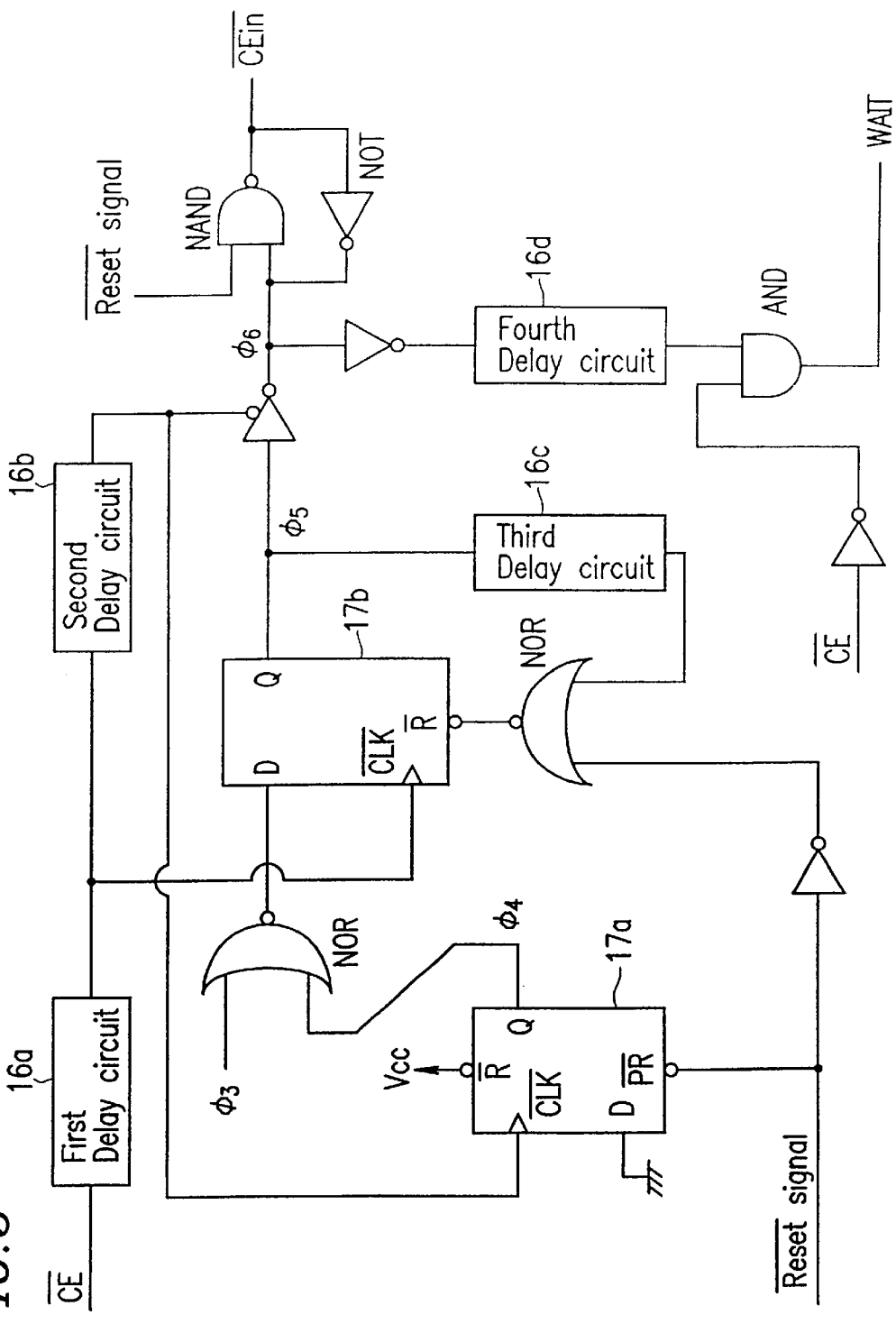
FIG. 5 is a circuit diagram showi ng an example of a CEin-bar signal generation circuit used in the present invention.

FIG. 5 is a circuit diagram showing an example of the CEin-bar signal generation circuit 13. The CEin-bar signal generation circuit 13 includes a first Delay circuit 16a, a second Delay circuit 16b, a third Delay circuit 16c, a fourth Delay circuit 16d, and D-type flip flops 17a and 17b.

When the reset bar signal (any one of the system reset signal and the reset signal inside the device) is "LOW", the reset bar signal indicates that a system including the NVDRAM is in the reset state. In this case, the CEin-bar signal is "HIGH", the internal signal $\phi4$ is "HIGH", and the internal signal $\phi5$ is "LOW".

A previous row address does not exist immediately after the system reset (including the case of Power On Reset immediately after power-on). Therefore, matching of the row addresses is forced only immediately after reset by the D-type flip flop 17a. Specifically, when the CE-bar signal is changed from "HIGH" to "LOW"immediately after reset (including the case immediately after power-on), the internal signal $\phi4$ is changed from "HIGH" to "LOW" and the internal signal $\phi5$ holds "LOW" after waiting times determined by the first and second Delay circuit 16a and 16b. In this case, the CEin-bar signal is changed from "HIGH" to "LOW", and the recall operation is initiated with respect to a memory cell. selected by a row address. The first Delay circuit 16a is used to wait for a time more than or equal to a time which is required to compare row addresses. The second Delay circuit 16b is used to wait for a time more than or equal to a time which is required to establish the internal signal $\phi5$.

The internal signal φ6 is initially "LOW", because the reset bar signal is "LOW". The WAIT signal which is inverse to the internal signal φ6 is "HIGH". Thereafter, when the CE-bar signal is changed from "HIGH" to "LOW", the signal φ6, which is inverse to the signal φ5 which is "LOW", is "HIGH". Therefore, the WAIT signal is changed from "HIGH" to "LOW" after a waiting time which isdetermined-bythefourthDelaycircuit 16d. ThefourthDelay circuit 16d causes the wait signal to be "HIGH" in the recall operation, and thus can instruct the CPU or the control circuit to hold the read/write states (not shown).

Thereafter, when a row address in a current cycle is the same as a row address in a previous cycle, the signal φ3 from the comparison circuit 12 is "HIGH". Therefore, the internal signal φ5 and the CEin-bar signal hold "LOW" even when the CE-bar signal is changed.

When a row address in a current cycle is not the same as a row address in a previous cycle, the signal φ3 from the comparison circuit 12 is "LOW". Therefore, the internal signal φ5 and the CEin-bar signal are changed from "LOW" to "HIGH" when the CE-bar signal is changed to "LOW". In this case, the store operation is initiated with respect to a memory cell which has been selected by a row address in the previous cycle. Thereafter, the internal signal φ5 is changed from "HIGH" to "LOW" after a waiting time determined by the third Delay circuit 16c. Therefore, the waiting time of the third Delay circuit 16c is set to a time more than or equal to a time which is required for the store operation. The CEin-bar signal is also changed from "HIGH" to "LOW", initiating the recall operation with respect to a memory cell selected by a current row address.

The WAIT signal is "HIGH" during the store and recall operations and outputs a WAIT request to the CPU and the control circuit.

When the fourth Delay circuit is omitted, the overall circuits can be simplified. In the synchronous type and the burst mode type, a synchronization clock signal is input from an external control system. A Delay circuit may count the number of the synchronization clock signals. In this case, the Delay circuit can be simplified and the synchronization can be reliably obtained, thereby reducing variation in delay time.

FIG. 1 shows a structure in which the resetbar signal is used. In this case, the reset-bar signal (e.g., RP (Reset Power Down) signal) is "LOW" upon power-on or power-off so that the chip is in the reset state. This leads to protection of data stored in the memory cell against system noise upon power-on or power-off. Upon power-on the reset-bar signal is "LOW". The reset-bar signal is "HIGH" after a power supply reaches a predetermined voltage so that the chip is released from the reset state. Thereafter, when a row address is input, a previous row address does not exist, so that the recall operation is unconditionally performed. Upon power-off or system reset, the reset-bar signal may be set to "LOW" so that current consumption can be reduced. When the reset-bar signal is changed from "HIGH" to "LOW", the chip is reset after the store operation is performed inside the device.

Figure 6:
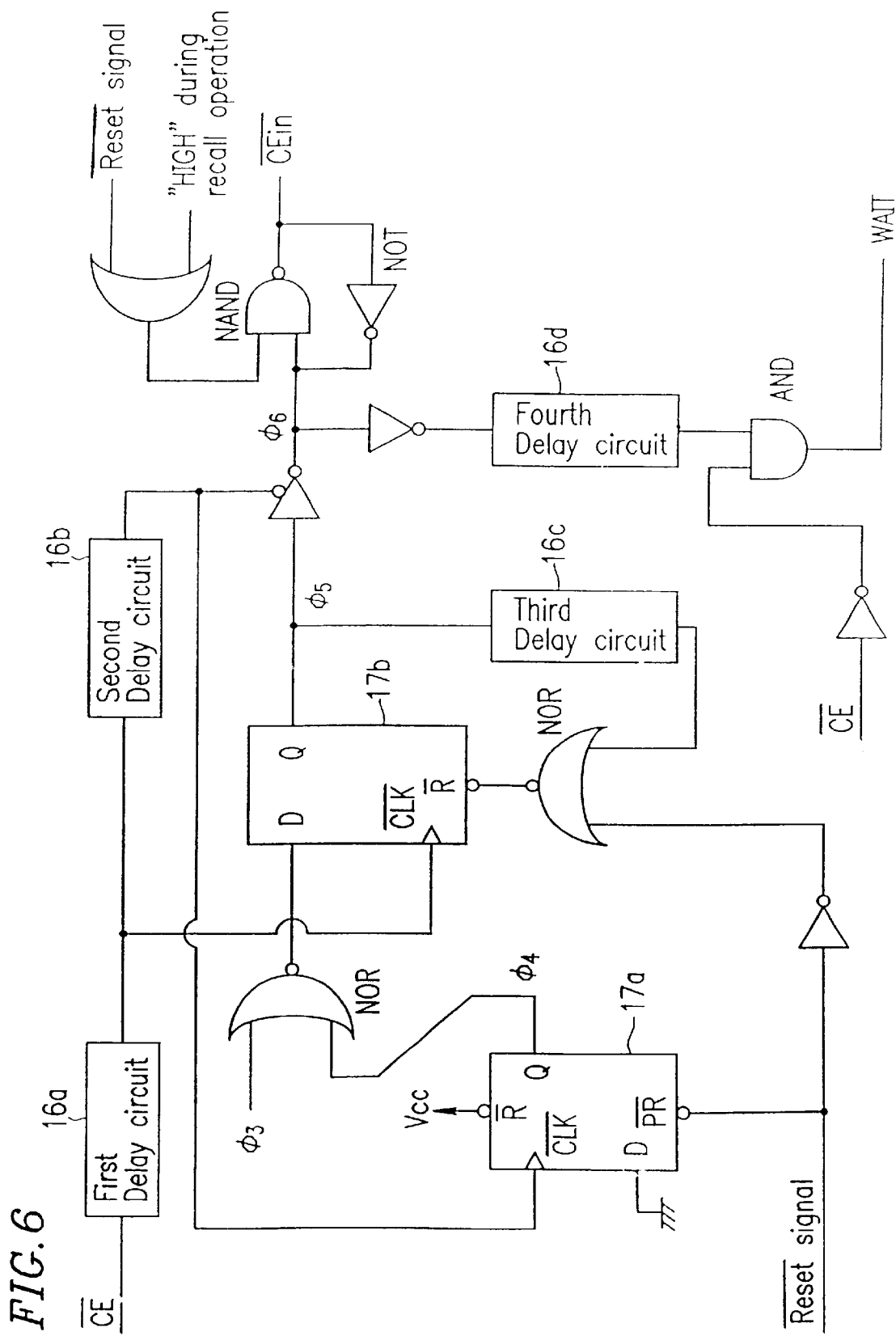
FIG. 6 is a circuit diagram showing another example of a CEin-bar signal generation circuit used in the present invention.

In this case, the store operation may be initiated after the recall operation is completed so that data is not destroyed during a period of time when the recall operation is performed inside the device. This can be realized by changing part of the circuit configuration shown in FIG. 5 to what is shown in FIG. 6. In the configuration shown in FIG. 6, the signal which is "HIGH" during the recall operation is generated by a latch circuit which, for example, is "HIGH" when the CEin-bar signal is changed from "HIGH" to "LOW", and which is changed from "HIGH" to "LOW" when the recall operation is completed.

The reset-bar signal may be input through an external pin such as an existing RP-bar terminal. Alternatively, the reset-bar signal may be input by a command. Alternatively, the reset-bar signal may be input by applying a high voltage to a particular pin.

Figure 7A:
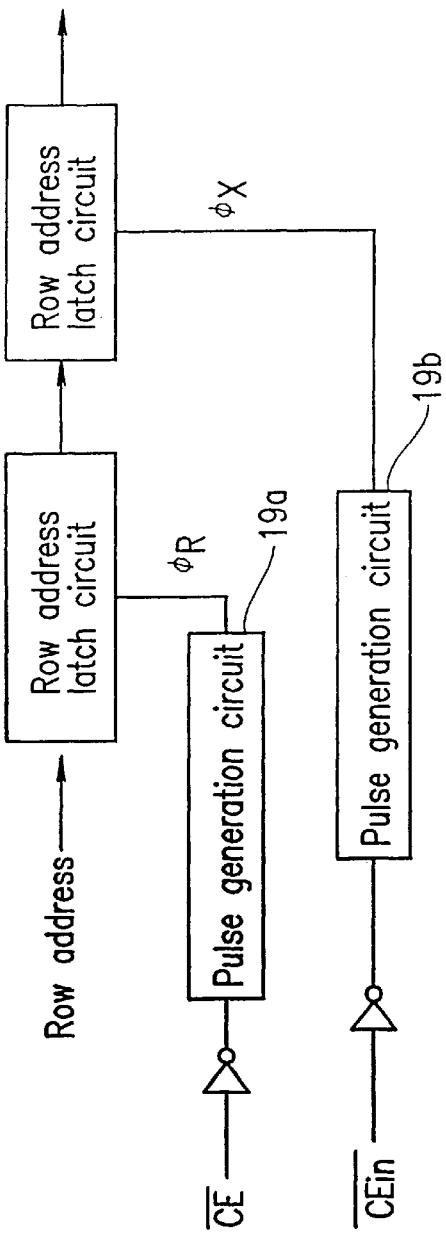
FIG. 7A is a block diagram showing an example of a row address latch circuit used in the present invention.
Figure 7B:
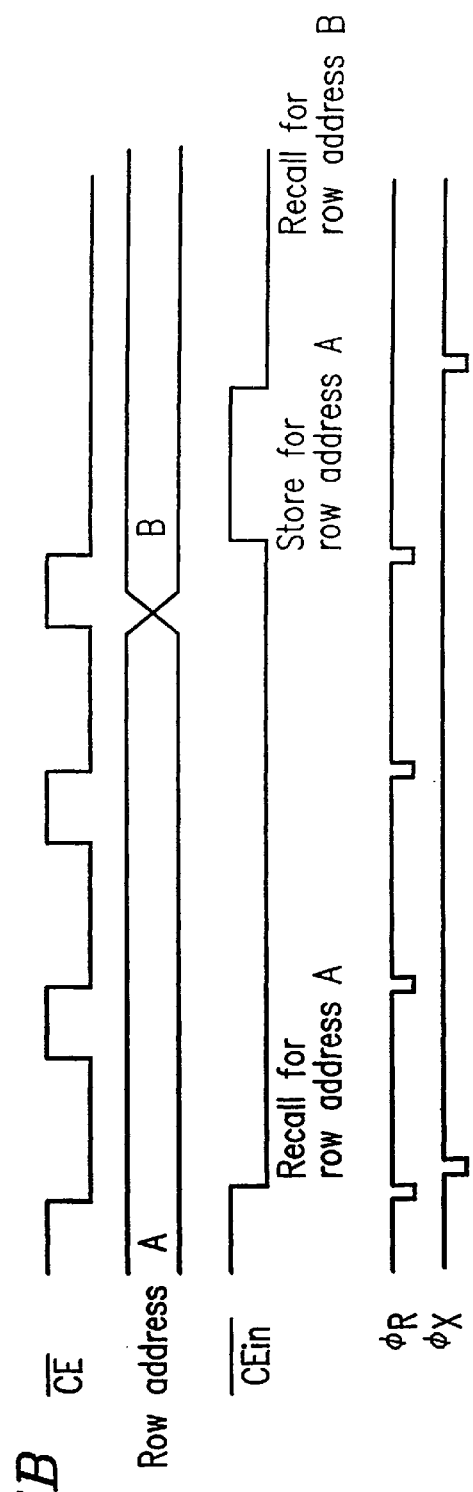
FIG. 7B is a timing chart for explaining the operation of the row address latch circuit.

FIG. 7A is a block diagram showing an example of the row address latch circuit shown in FIG. 1. FIG. 7B is a timing chart for explaining the operation of the row address latch circuit. The row address latch circuit includes a row address latch circuit 18a, a row address latchcircuit 18b, a pulse generation circuit 19a and a pulse generation circuit 19b. When the control signal CE-bar is changed from "HIGH" to "LOW", a pulse signal φR is generated and the row address latch circuit 18a is latched to a row address A. The control signal CEin-bar is changed from "HIGH" to "LOW", a latch transfer pulse is generated in a pulse signal φx and the row address latch circuit 18b is latched to the row address A. The pulse signal φx is used for the recall operation with respect to a new row address B.

Figure 8A:
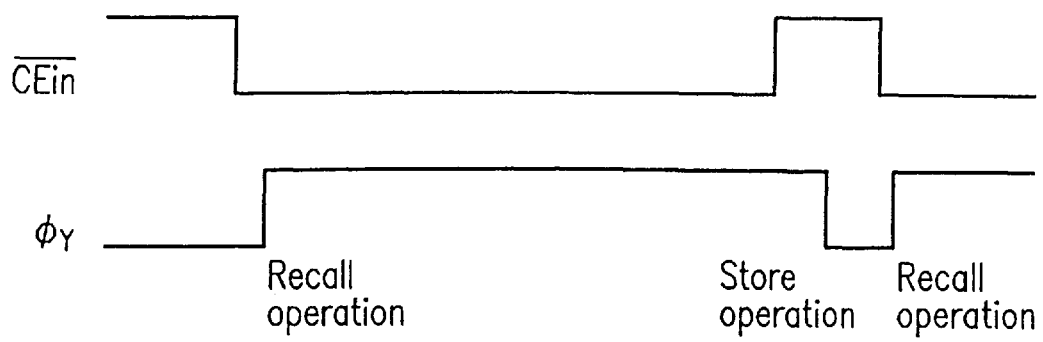
FIG. 8A is a timing chart showing an example of a control signal waveform (word line driving form) for controlling the operation of the row decoder circuit upon the recall and store operations.
Figure 8B:
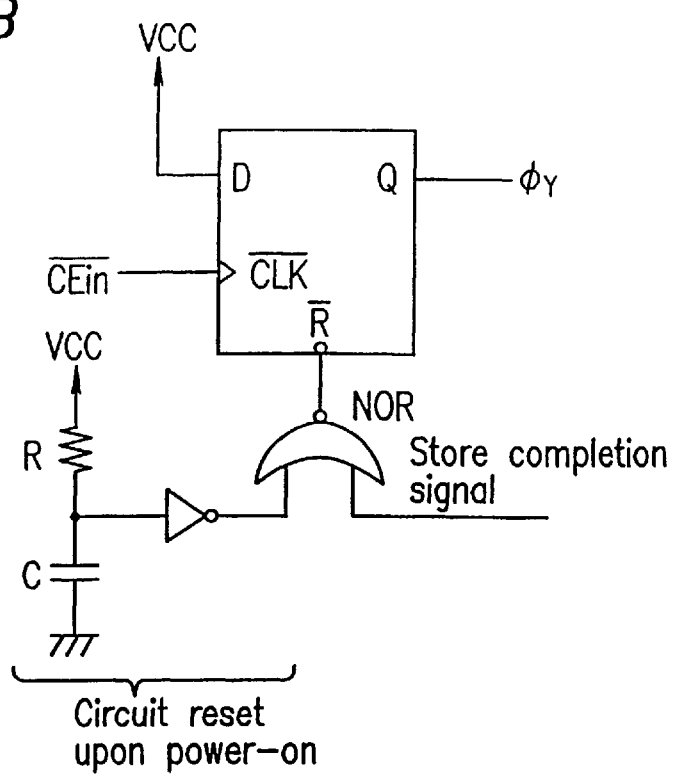
FIG. 8B is a circuit diagram showing an example of a circuit configuration for realizing the control signal waveform.

FIG. 8A is a timing chart showing an example of a control signal waveform (word line driving form) for controlling the operation of the row decoder circuit upon the recall and store operations. FIG. 8B is a circuit diagram showing an example of a circuit configuration for realizing the control signal waveform. Here, when the control signal CEin-bar is "LOW", a row decoder control signal φy is "HIGH". Upon power-on, the row decoder control signal φy is reset to "LOW" by a signal ("HIGH") from a reset circuit and a signal ("HIGH" pulse) indicating store operation completion. According to this configuration, the circuit for generating the row decoder control signal can be simplified.

Figure 9A:
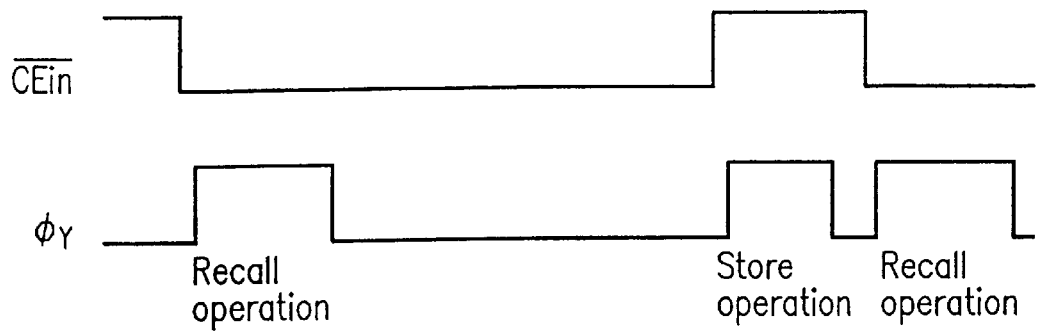
FIG. 9A is a timing chart showing another example of a control signal waveform (word line driving form) for controlling the operation of the row decoder circuit upon the recall and store operations.
Figure 9B:
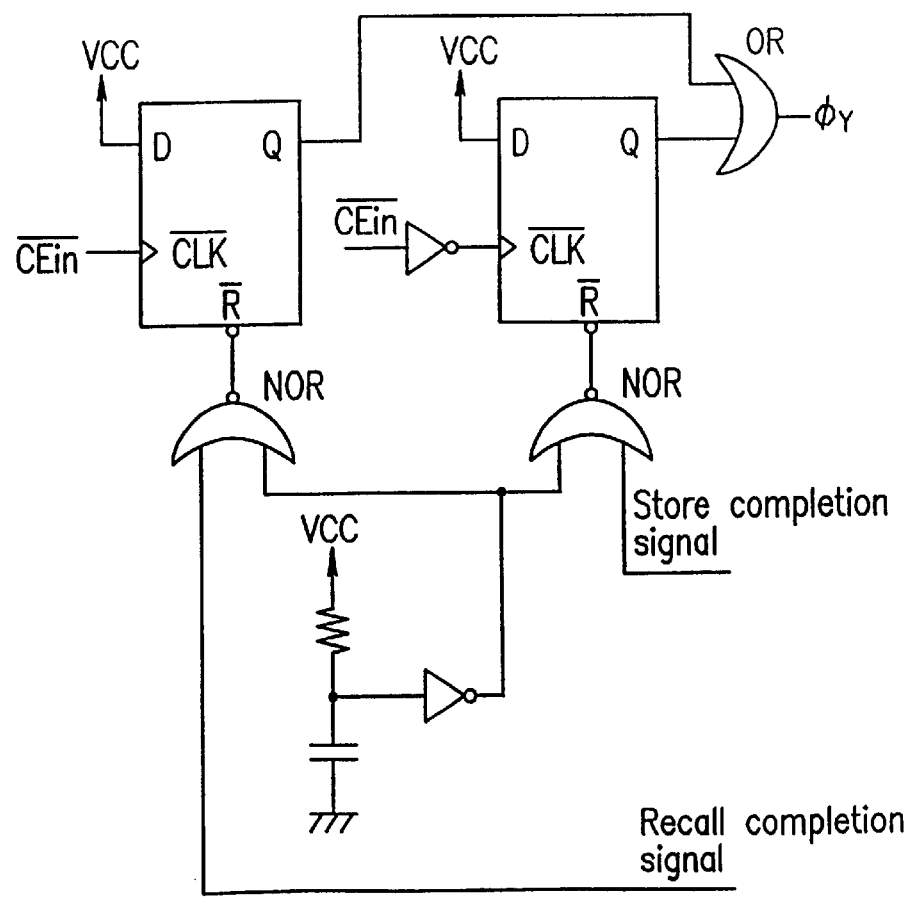
FIG. 9B is a circuit diagram showing an example of a circuit configuration for realizing the control signal waveform.

FIG. 9A is a timing chart showing another example of a control signal waveform (word line driving form) for controlling the operation of the row decoder circuit upon the recall and store operations. FIG. 9B is a circuit diagram showing an example of a circuit configuration for realizing the control signal waveform. Here, when the control signal CEin-bar is changed from "HIGH" to "LOW", the row decoder control signal φy is changed from "LOW" to "HIGH". When the recall operation is completed (a recall completion signal goes to "HIGH" and then reset), the row decoder control signal φy is changed from "HIGH" to "LOW". When the control signal CEin-bar is changed from "LOW" to "HIGH", the row decoder control signal φy is changed from "LOW" to "HIGH". When the store operation is completed (a store completion signal goes to "HIGH" and then reset), the row decoder control signal φy is changed from "HIGH" to "LOW". With this configuration, the row decoder is controlled by the pul se signal, thereby reducing power co nsumption.

Figure 10:
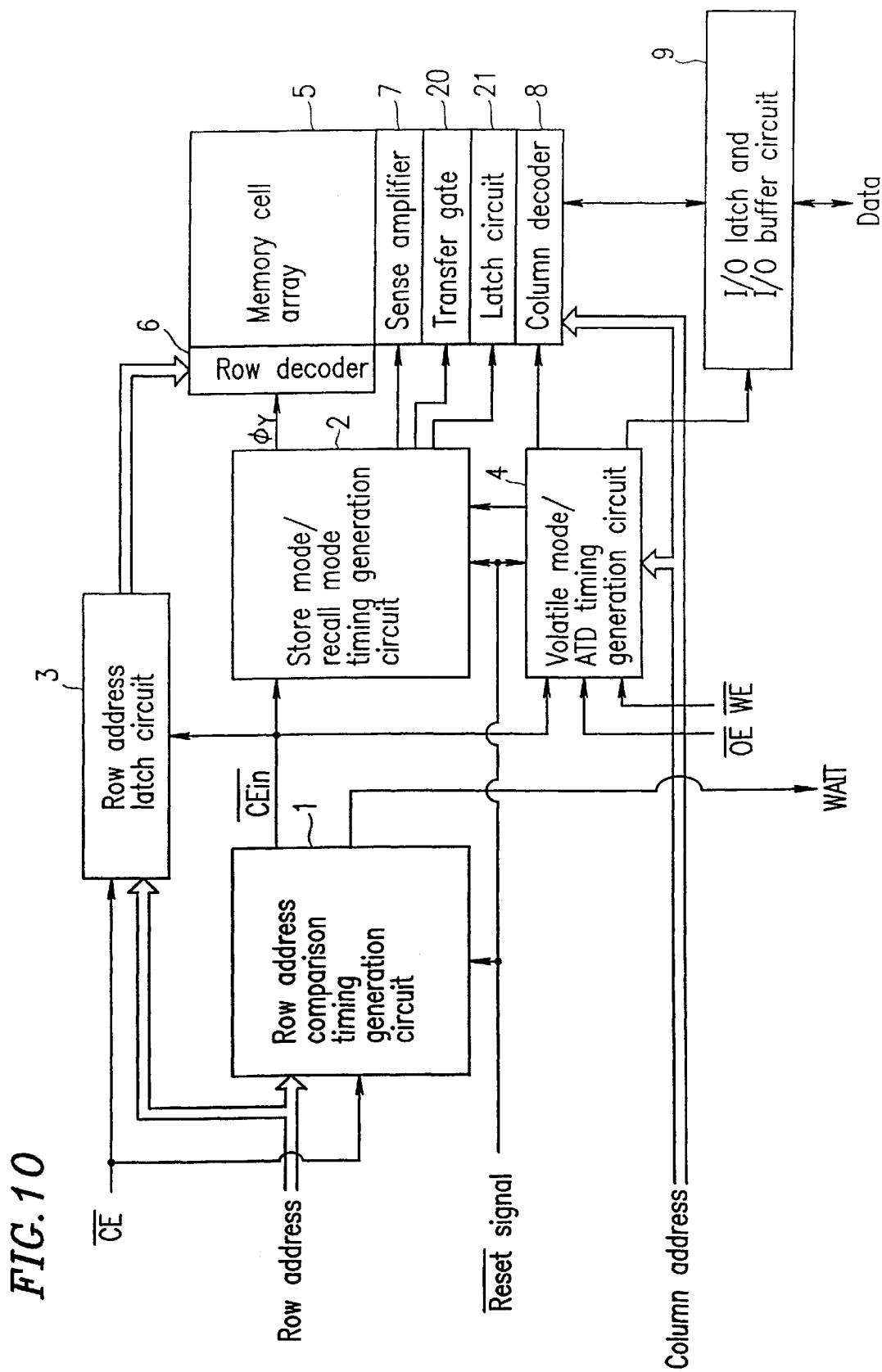
FIG. 10 is a block diagram showing another configuration of an NVDRAM according to the present invention.
Figure 11:
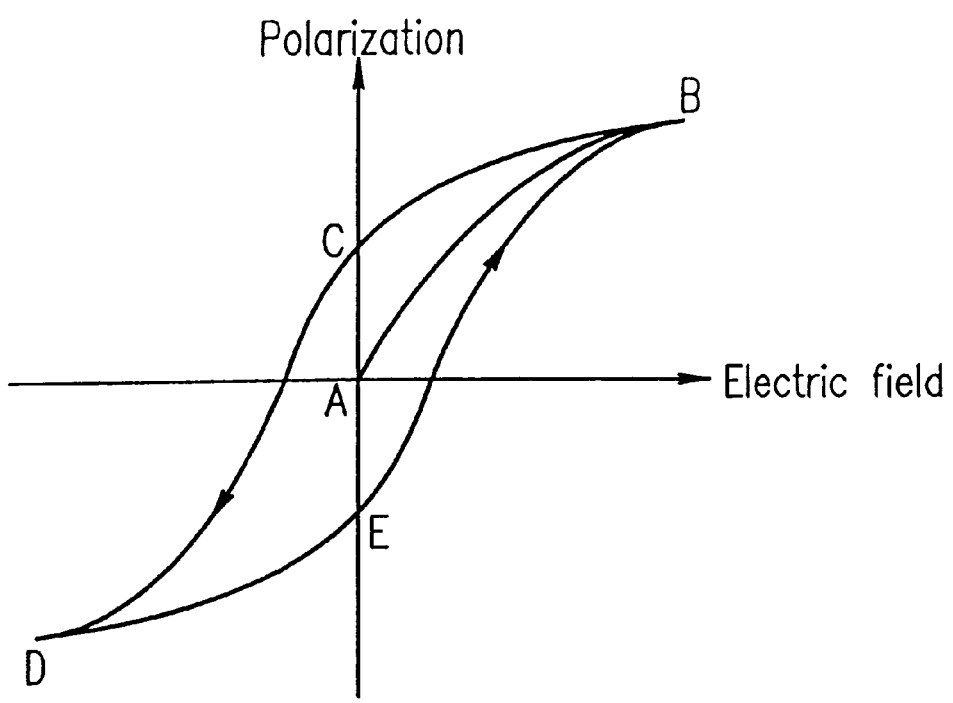
FIG. 11 is a diagram showing the hysteresis characteristic of a ferroelectric material.

FIG. 10 is a block diagram showing another configuration of the NVDRAM according to another embodiment of the present invention. In the configuration shown in FIG. 1, volatile data obtained by the recall operation is stored in the sense amplifier. In the configuration shown in FIG. 10, the volatile data is transferred and stored in a latch circuit 21 rather than the sense amplifier. The data read by the recall operation is transferred and stored to the latch circuit 21 via an opened transfer circuit (gate) 20. Upon the store operation, the transfer gate 20 is opened, so that data is transferred to the sense amplifier 7 and a memory cell from the latch circuit 21.

When the NVDRAM of the present invention is applied to another NVDRAM and a system, a CE-bar signal, an OE-bar signal, a WE-bar signal, an address signal, a data input signal, and a data output signal, which are required for control of the NVDRAM, are provided by a system control circuit (logic circuit), a system solution chip, a system CPU, or a system MPU. At least a chip selection signal, a read/write control signal, and a data signal are provided. In this case, the row address comparison/timing generation circuit 1 shown in FIG. 1 can be incorporated into a system control circuit (logic circuit), a system solution chip, a system CPU, or a system MPU.

In the NVDRAM, memory cells are accessed word line (row address) by word line. Hundreds to thousands of memory cells are connected to one word line (row address). For this reason, even when 8-bit data is read out, the recall operation (read operation of data stored in the non-volatile state) is performed word line by word line. Similarly, in the case of the write operation, the recall operation is performed with respect to data except for the write bits word line by word line.

Therefore, in the NVDRAM or a system using the NVDRAM, the row addresses in the memory cell array are assigned to higher bits of an address bus or address pin. This has more satisfactory usability than when the row addresses and column addresses for the memory cell array are randomly arranged in the address bus. In the latter case, an external system (e.g., memory card) is used so as to assign the addresses again (address scramble) in such a way that the row address is assigned to higher address pins and the column address is assigned to lower address pins. This leads to satisfactory matching between the addresses of the external system and the address inside the device, thereby obtaining more satisfactory usability.

When a number of the NVDRAMs or systems are used, each NVDRAM is selected by the CE-bar signal ($CE_1, \ldots, CE_n$) decoded by an address. In only the selected NVDRAM, when the CE-bar signal is active ("LOW"), non-volatile data stored in a memory cell selected by a row address is transformed into volatile data in the recall operation. The resulting data is temporarily stored in a sense amplifier. Alternatively, the data is transferred from the sense amplifier to a latch circuit in which the data is temporarily stored. Thereafter, when a row address determination circuit (e.g., a row address comparison/timing generation circuit) for the NVDRAM selected upon the read or write operation determines that a row address in a current cycle is different from a row address in the previous cycle, the NVDRAM performs the recall operation. In this case, the WAIT signal output from the WAIT signal generation circuit is "HIGH", requesting that a wait state is inserted into (i.e., the WAIT signal is applied to) a peripheral control circuit, an MPU, or the like. When row address determination circuit determines that a row address in a current cycle is the same as a row address in the previous cycle, the NVDRAM does not perform the recall operation. In this case, the WAIT signal output from the WAIT signal generation circuit is "LOW", informing the peripheral control circuit, the MPU, or the like that the read operation can be performed immediately.

In the above-described embodiments, the non-synchronous NVDRAMs are described. The NVDRAM of the present invention may have a synchronous circuit configuration which receives a synchronous signal, such as a synchronous DRAM or a Rambus DRAM. In such a case, the synchronous signal can be utilized in the delay circuit, so that the configuration of the delay circuit can be simple, thereby reducing variation in delay time.

Further, the multiplex type NVDRAM can be provided in which the row address and the column address are divided in accordance with time and the divided addresses are taken in through the RAS-bar and the CAS-bar.

In addition to the above-described NVDRAM, various embodiments of the present invention can be provided, not departing from the viewpoints and methods of the present invention. For example, a non-volatile memory device using a tunnel magnetoresistance (TMR) film or a giant magnetoresistance (GMR) film can be used instead of the EEPROM. When the NVDRAM includes a plurality of memory cell arrays, the present invention can be applied to each memory cell array, thereby obtaining the similar effects. The above description and the drawings used herein do not limit the present invention in any manner.

As NVDRAMs, the combination type NVDRAM including a DRAM as a volatile data storage means and an EEPROM as a non-volatile data storage means, and the ferroelectric type NVDRAM including a memory cell having volatile and non-volatile storage capabilities are described above. In these NVDRAMs having a memory cell having volatile and non-volatile data storage capabilities, when an activation signal is input for activating a read cycle of reading data stored in a memory cell or a write cycle of writing data into the memory cell, the row address determination circuit can determine whether a column address (word line address) input in a current read/write cycle is the same as a column address input in the previous read/write cycle.

When the row addresses differs from each other between the current and previous cycles, the store operation is performed for a memory cell which has been selected by a row address in the previous cycle, where data stored in the volatile state is transformed into data stored in the non-volatile state. Thereafter, the recall operation is performed for a memory cell which is selected by a row address in the current cycle, where data stored in the memory cell in the non-volatile state is transformed into data in the volatile state for the purpose of reading. The obtained data stored in the memory cell in the volatile state is also stored in a sense amplifier connected to a column address corresponding to the memory cell, or the latch circuit rather than the sense amplifier, whereby the number of polarization reversal can be reduced. Further, when data is stored in the volatile state in the sense amplifier or the latch circuit, the refresh operation which is performed in the conventional volatile DRAM is not required, thereby reducing power consumption.

When a row address selected in the current cycle is the same as a row address selected in the previous cycle, the read/write operations are performed with respect to data stored in the volatile state in a memory cell or a sense amplifier or latch circuit connected to a column address corresponding to the memory cell. In this case, the data stored in the non-volatile state is not read from or written to the memory cell. This leads to a reduction in power consumption, and the operations using polarization reversal can be eliminated, thereby obtaining a high-speed read operation. When the write operation is performed with respect to external data, the data is written into the sense amplifier or the latch circuit is used, so that the refresh operation which is performed in the conventional volatile DRAM is not required, thereby reducing power consumption. Moreover, an SRAM having a small capacity can be omitted, thereby reducing cost.

When a device or system is turned on (powered on), a previous address is not specified. In this case, the recall operation can be controlled utilizing a reset signal which changes upon power-on (e.g., a system reset signal, or a reset signal within the device). Upon power-on, power-off, or when the system is reset, the recall and store operations can be performed utilizing a system reset signal which inactivates the whole system, whereby an erroneous write operation due to noise can be prevented.

For example, when the CE-bar (or the RAS-bar in the case of the address multiplex type) is activated ("LOW") after power-on, the recall operation is performed with respect to a memory cell provided along a word line selected by a current row address. The resulting data obtained is then stored in the memory cell and a sense amplifier or a latch circuit connected to the corresponding column address. When a row address in a current cycle is the same as a row address in the previous cycle (a CEin-bar keeps the active ("LOW") state), the read/write operation is performed with respect to data stored in the sense amplifier or the latch circuit connected to the corresponding column address. When a row address in a current cycle is different from a row address in the previous cycle (a CEin-bar keeps the inactive ("HIGH") state), the store operation is performed with respect to data stored in the volatile state in the sense amplifier or the latch circuit is stored as data in the non-volatile state.

Whereas in the conventional NVDRAMs the recall operation is performed with respect to a memory cell using an NE (Non-Volatile Enable)-bar signal which enables a non-volatile operation, the recall operation is performed with respect to a memory cell selected by a row address when the CE-bar signal (or the RAS-bar signal in the case of the address multiplex type) is active ("LOW") so that data is stored in the volatile state in a sense amplifier or the like which does not require the refresh operation and the other memory cells are used in the non-volatile mannerwhich does not requiretherefreshoperation. Thus, the refresh operation is not required for data stored in the volatile state, thereby reducing unnecessary power consumption. The CE-bar signal (or the RAS-bar signal) also serves as the NE-bar signal, so that a user does not recognize the NE-bar signal. Therefore, the NVDRAM of the present invention can be used in a way similar to that of the conventional volatile DRAMs, analogous SRAMs, or SRAMs, thereby obtaining satisfactory usability.

Further, the column address may be assigned to lower address pin terminals ($A_0$-) and the row address may be assigned to higher address pin terminals. The address pin terminals are selected in ascending order from the lower address. This allows satisfactory compatibility with a system CPU and a control circuit, thereby obtaining satisfactory usability.

Typically, the number of column addresses having the same row address is about 100 to about 1000. The present invention is particularly effective to the case where data stored at serial addresses (e.g., file memory) are used. For example, the number of available polarization reversals ($10^{12}$ to $10^{13}$) is multiplied by the number of the column addresses (100 to 1000). The result is $10^{15}$ to $10^{16}$ which corresponds to the number of rewrite operations. The 10-year continuous operation (with a cycle of 100 nsec) can be achieved.

Further, in a synchronous system or a burst system in which the read/write operations may be performed in synchronization with a synchronization signal from an external control system or the like, a high-speed operation can be realized and the configuration of the delay circuit can be simplified.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device including:
    a memory cell array including memory cells capable of storing data in a volatile state and in a non-volatile state, the memory cells arranged in a matrix; and
    a row address determination circuit for determining whether a row address in a current cycle is the same as a row address in a previous cycle when an activating signal is received,
        wherein when it is determined that the row address in the current cycle is different from the row address in the previous cycle, a store operation is performed with respect to the memory cell selected in the previous cycle, where data previously stored in a volatile state in the memory cell selected in the previous cycle is transformed into a non-volatile state in the memory cell selected in the previous cycle; thereafter, a recall operation is performed where data previously stored in a non-volatile state in the memory cell selected in the current cycle is transformed into a volatile state; and said data in the volatile state is stored in the memory cell and a sense amplifier connected to a corresponding column address, or at least one of the sense amplifier and a latch circuit; and
        when the row address in the current cycle is the same as the row address in the previous cycle, a read or write operation is performed with respect to data in a volatile state stored in the memory cell selected in the current cycle, or the sense amplifier or latch circuit connected to a corresponding column address, but data in the non-volatile state is not read from or written to the memory cell selected in the current cycle.

2. A non-volatile semiconductor memory device according to claim 1, wherein when the read operation is performed immediately after power-on, a reset signal changing upon power-on or a reset signal inside the device is used in the recall operation.

3. A non-volatile semiconductor memory device according to claim 1, wherein upon power-off or reset, a reset signal changing upon power-of f or reset, or a reset signal inside the device is used in the store operation.

4. A non-volatile semiconductor memory device according to claim 1, wherein a column address is assigned to lower address pin terminals, and the row address is assigned to higher address pin terminals; and an external address is input.

5. A non-volatile semiconductor memory device according to claim 1, wherein each memory cell includes a combination of a DRAM as a volatile data storage means and an EEPROM as a non-volatile data storage means.

6. A non-volatile semiconductor memory device according to claim 1, wherein each memory cell is made of a ferroelecric material; and data is stored in a non-volatile state in each memory cell using polarization reversal and data is stored in a volatile state in each memory cell without using the polarization reversal.

7. A non-volatile semiconductor memory device according to claim 1, wherein the device is controlled in such a way that a driving signal for driving a word line connected to the memory cell is in the enable state during a period of time from the start of the recall operation to the end of the store operation.

8. A non-volatile semiconductor memory device according to claim 1, wherein the device is controlled in such a way that a driving signal for driving a word line connected to each memory cell is in the enable state only during the recall operation and the store operation.

9. A non-volatile semiconductor memory device according to claim 1, wherein the store operation is initiated after the recall operation is completed.

10. A non-volatile semiconductor memory device according to claim 1, wherein the read or write cycle is performed in synchronization with an external synchronization signal.

11. A non-volatile semiconductor memory device according to claim 1 further Includes a circuit for generating a WAIT signal, wherein the WAIT signal is inactive during the recall operation and the store operation.

12. A non-volatile semiconductor memory device according to claim 1 further includes a latch circuit for latching one of the row address in the current cycle and the row address in the previous cycle at least during the read cycle and the write cycle.

13. A system LSI including a non-volatile semiconductor memory device according to claim 1.

* * * * *

UNITED STATES PATENT AND TRADEMARK OFFICE
CERTIFICATE OF CORRECTION

PATENT NO. : 6,370,058 B1
DATED : April 9, 2002
INVENTOR(S) : Katsumi Fukumoto

It is certified that error appears in the above-identified patent and that said Letters Patent is hereby corrected as shown below:

Title page,
Item [22], Filed: "Sep. 6, 2000" should be -- Sep. 5, 2000 --.
Item [56], FOREIGN PATENT DOCUMENTS, "JP   7-13859   1/1799" should be -- JP   7-13859   1/1995 --.

Column 2,
Line 36, "polarizaed" should be -- polarized --;

Column 3,
Line 31, "signalinput" should be -- signal input --;
Line 67, "avoltage" should be -- a voltage --;

Column 5,
Line 65, "decodersareprovided" should be -- decoders are provided --;

Column 6,
Line 8, "$A_5$" should be -- $A_8$ --;

Column 7,
Line 53, "ferroelecric" should be -- ferroelectric --;

Column 8,
Line 33, "the store operation Is" should be -- the store operation is --;

Column 10,
Line 10, "exampe" should be -- example --;
Line 20, "cell is in. the enable state" should be -- cell is in the enable state --;

Column 11,
Line 14, "showi ng" should be -- showing --;

Column 12,
Line 46, "RF/RCi-bar="THIGH"" should be -- RF/RCi-bar="HIGH" --;

Column 13,
Line 51, "The OE-barsignal" should be -- The OE-bar signal --;

Column 14,
Line 6, "the latch circuit 11b" should be -- the latch circuit 11*b* --;
Line 7, "the latch control signal $\Phi 2$" should be -- the latch control signal $\Phi 1$ --;
Line 62, "a memory cell. selected" should be -- a memory cell selected --;

UNITED STATES PATENT AND TRADEMARK OFFICE
CERTIFICATE OF CORRECTION

PATENT NO.    : 6,370,058 B1
DATED         : April 9, 2002
INVENTOR(S)   : Katsumi Fukumoto It is certified that error appears in the above-identified patent and that said Letters Patent is hereby corrected as shown below:

Column 15,
Lines 7-8, "which isdetermined-bythefourthDelaycircuit" should be -- which is determined by the fourth Delay circuit --
Line 8, "Thefourth Delay circuit 16*d*" should be -- The fourth Delay circuit 16*d* --;

Column 16,
Line 13, "address latchcircuit 18*b*" should be -- address latch circuit 18*b* --;
Line 52, "pul se signal" should be -- pulse signal --;
Line 53, "power co nsumption" should be -- power consumption --;

Column 19,
Lines 33-34, "mannerwhich does not requiretherefreshoperation" should be -- manner which does not require the refresh operation --.

Signed and Sealed this

Twenty-second Day of October, 2002

*Attest:*

*Attesting Officer*

JAMES E. ROGAN
*Director of the United States Patent and Trademark Office*